(12) United States Patent
Wiese et al.

(10) Patent No.: US 8,324,602 B2
(45) Date of Patent: Dec. 4, 2012

(54) OPTICAL SENSORS THAT REDUCE SPECULAR REFLECTIONS

(75) Inventors: Lynn K. Wiese, Santa Clara, CA (US); Nikhil Kelkar, Saratoga, CA (US); Viraj Patwardhan, Milpitas, CA (US)

(73) Assignee: Intersil Americas Inc., Milpitas, CA (US)

( * ) Notice: Subject to any disclaimer, the term of this patent is extended or adjusted under 35 U.S.C. 154(b) by 450 days.

(21) Appl. No.: 12/643,831

(22) Filed: Dec. 21, 2009

(65) Prior Publication Data

US 2010/0258710 A1 Oct. 14, 2010

Related U.S. Application Data

(63) Continuation-in-part of application No. 12/499,723, filed on Jul. 8, 2009, now Pat. No. 8,232,541.

(60) Provisional application No. 61/263,307, filed on Nov. 20, 2009, provisional application No. 61/218,867, filed on Jun. 19, 2009, provisional application No. 61/169,236, filed on Apr. 14, 2009.

(51) Int. Cl.
*G02B 27/00* (2006.01)
*H01J 40/14* (2006.01)

(52) U.S. Cl. ........................................ 250/551; 250/239

(58) Field of Classification Search ................ 250/551, 250/221, 239; 257/80–82; 438/24, 25
See application file for complete search history.

(56) References Cited

U.S. PATENT DOCUMENTS

| | | |
|---|---|---|
| 4,051,365 A | 9/1977 | Fukuyama et al. |
| 5,698,975 A | 12/1997 | Kayserman |
| 5,783,815 A | 7/1998 | Ikeda |
| 5,883,386 A | 3/1999 | Tsuyuki et al. |
| 6,369,380 B1 | 4/2002 | Hirai |
| 6,541,762 B2 | 4/2003 | Kang et al. |

(Continued)

FOREIGN PATENT DOCUMENTS

JP 2000-269544 9/2000

(Continued)

OTHER PUBLICATIONS

Office Action dated Nov. 1, 2011, in U.S. Appl. No. 12/499,723.

(Continued)

*Primary Examiner* — Thanh Luu

(74) *Attorney, Agent, or Firm* — Vierra Magen Marcus & DeNiro LLP

(57) ABSTRACT

An optical sensor device, according to an embodiment of the present invention, includes a light source and a light detector. The light source includes one or more light emitting elements, and the light detector includes one or more light detecting elements. A first opaque light barrier portion, between the light source and the light detector, is configured to block light from being transmitted directly from the light source to the light detector. A second opaque light barrier portion, extending from the first opaque light barrier portion in a direction towards the light source, is configured to reduce an amount of specular reflections that would occur if a light transmissive cover plate were placed over the optical sensor device. A third opaque light barrier portion, extending from the first light barrier portion in a direction towards to the light detector, is configured to reduce an amount of specular reflections that would be detected by the light detector, if a light transmissive cover plate were placed over the optical sensor device.

29 Claims, 18 Drawing Sheets

U.S. PATENT DOCUMENTS

| | | | |
|---|---|---|---|
| 6,977,645 | B2 | 12/2005 | Brosnan |
| 7,045,775 | B2 | 5/2006 | Leong et al. |
| 7,161,136 | B1 | 1/2007 | Wenstrand et al. |
| 7,196,316 | B2 | 3/2007 | Chan et al. |
| 7,309,855 | B2 | 12/2007 | Nagasaka et al. |
| 7,362,419 | B2 | 4/2008 | Kurihara et al. |
| 7,485,842 | B2 | 2/2009 | Bich et al. |
| 7,486,386 | B1 | 2/2009 | Holcombe et al. |
| 7,785,024 | B2 | 8/2010 | Fujimori |
| 7,842,957 | B2 | 11/2010 | Goh et al. |
| 8,035,079 | B2 | 10/2011 | Hane |
| 2001/0035450 | A1 | 11/2001 | Mannhart et al. |
| 2003/0189213 | A1 | 10/2003 | Igaki et al. |
| 2005/0087681 | A1 | 4/2005 | Chin et al. |
| 2006/0158887 | A1 | 7/2006 | Holder et al. |
| 2006/0180888 | A1 | 8/2006 | Tan et al. |
| 2006/0237540 | A1 | 10/2006 | Saxena et al. |
| 2006/0266938 | A1 | 11/2006 | Abela |
| 2007/0210267 | A1 | 9/2007 | Ishii et al. |
| 2008/0006762 | A1 | 1/2008 | Fadell et al. |
| 2008/0296478 | A1 | 12/2008 | Hernoult |
| 2010/0181578 | A1* | 7/2010 | Li et al. .......................... 257/82 |
| 2010/0282951 | A1 | 11/2010 | Costello et al. |
| 2010/0327164 | A1 | 12/2010 | Costello et al. |

FOREIGN PATENT DOCUMENTS

| | | |
|---|---|---|
| JP | 2002-267498 | 9/2002 |
| JP | 2004-071734 | 3/2004 |
| JP | 2005-037451 | 2/2005 |

OTHER PUBLICATIONS

Office Action dated Jan. 24, 2012, in U.S. Appl. No. 12/499,723.
Office Action dated Jan. 19, 2012, in U.S. Appl. No. 12/499,693.
International Search Report and Written Opinion for PCT/US2010/030606, mailed Nov. 16. 2010.
International Search Report and Written Opinion for PCT/US2010/030603, mailed Oct. 26, 2010.
Aslami, "Proposal for Ambient Light Sensor & Proximity Sensor," Sharp Corporation, 2 pages, Aug. 7, 2008.
Proximity Sensor, Lead (Pb) Free Product—RoHS Compliant, SFH 7741, Opto Semiconductors, pp. 1-13, Jan. 14, 2009.
Reflective Optical Switch, Lead (Pb) Free Product—RoHS Compliant, SFH 7740, Opto Semiconductors, pp. 1-13, Jan. 14, 2009.
Photo Sensor (Proximity/Ambient Light Sensor, Model No. GP2AP002A00F, Sharp Corporation, pp. 1-33, Oct. 27, 2008.
APDS-9800, Integrated Ambient Light and Proximity Sensor (Built-in LED), Prelim Datasheet (version 5), Avago Technologies, 22 pages, 2005.
APDS-9120, "Integrated Optical Proximity Sensors," Data Sheet, Avago Technologies, Mar. 24, 2010.
APDS-9801, "Digital Proximity and Analog Ambient Light Sensor," Avago Technologies, Sep. 6, 2010.
HSDL-9100, "Surface-Mount Proximity Sensor," Avago Technologies, Nov. 26, 2009.
"Avago Technologies Announces APDS-9120, Ultra-Thin Integrated Optical Proximity Sensor for Wide Range of Portable Consumer Electronic Devices and Personal Computers," Embedded System News .Com, http://embeddedsystemnews.com/avago-technologies-announces-apds-9120-ultra-thin-integrated-optical-proximity-sensor-for-wide-range-of-portable-consumer-electronic-devices-and-personal-computers.html, Jul. 1, 2009.
"Avago Technologies Announces APDS-9800, Ultra-Thin Integrated Sensor Module for Use in Mobile Phones," Embedded System News .Com, http://embeddedsystemnews.com/avago-technologies-announces-apds-9800-ultra-thin-integrated-sensor-module-for-use-in-mobile-phones.html, Sep. 10, 2009.
Office Action dated Apr. 13, 2012, in U.S. Appl. No. 12/490,723.
Ambient Light Sensor, AL3005 Data Sheet, Lite-On Semiconductor Corp., pp. 1-21 (prior to Apr. 2009).

* cited by examiner

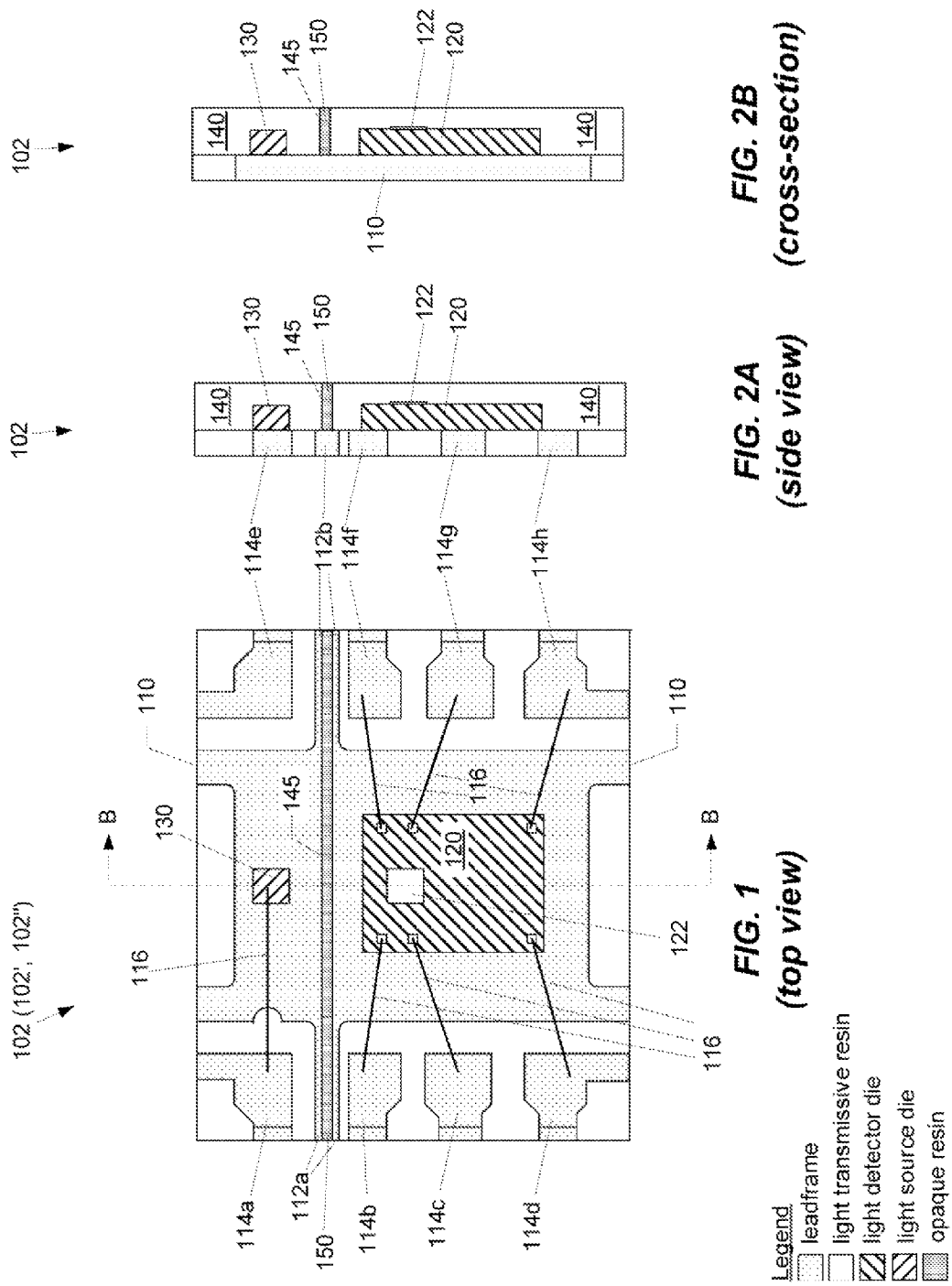

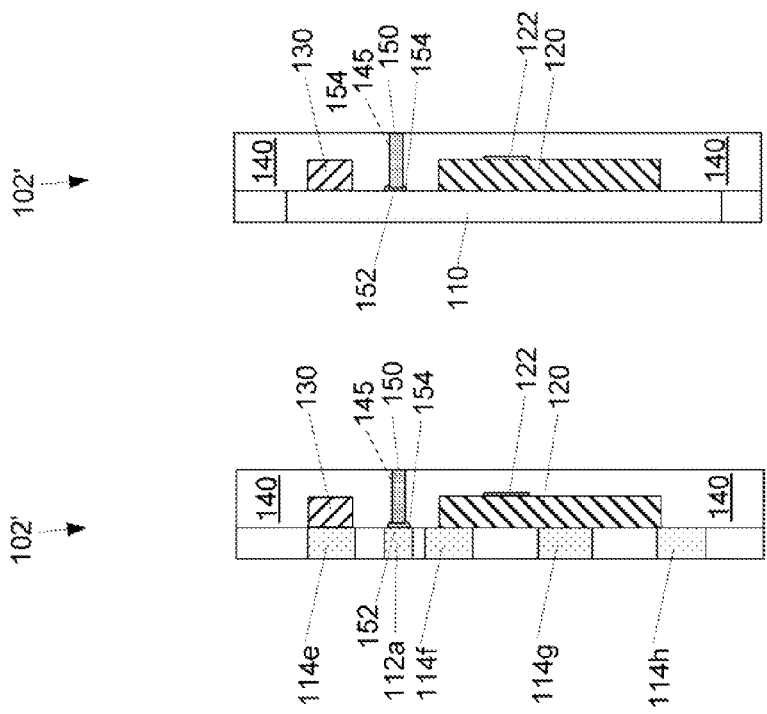
*FIG. 3A (side view)*     *FIG. 3B (cross-section)*
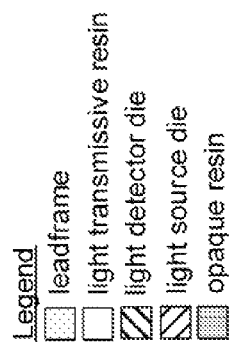

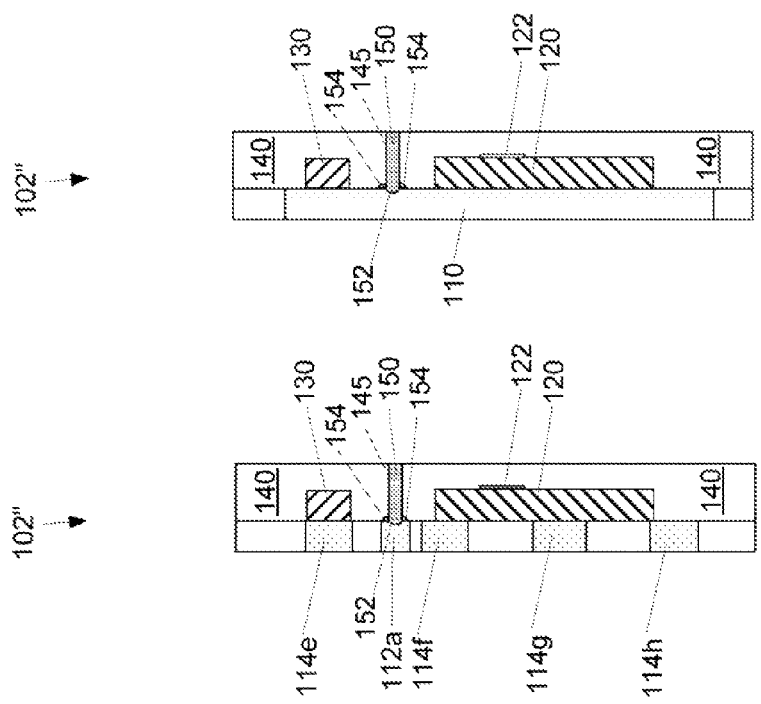
FIG. 4A *(side view)*
FIG. 4B *(cross-section)*
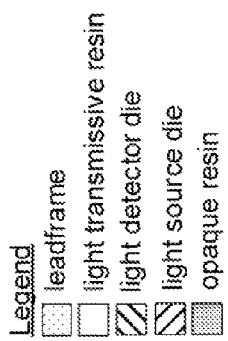
Legend
- leadframe
- light transmissive resin
- light detector die
- light source die
- opaque resin

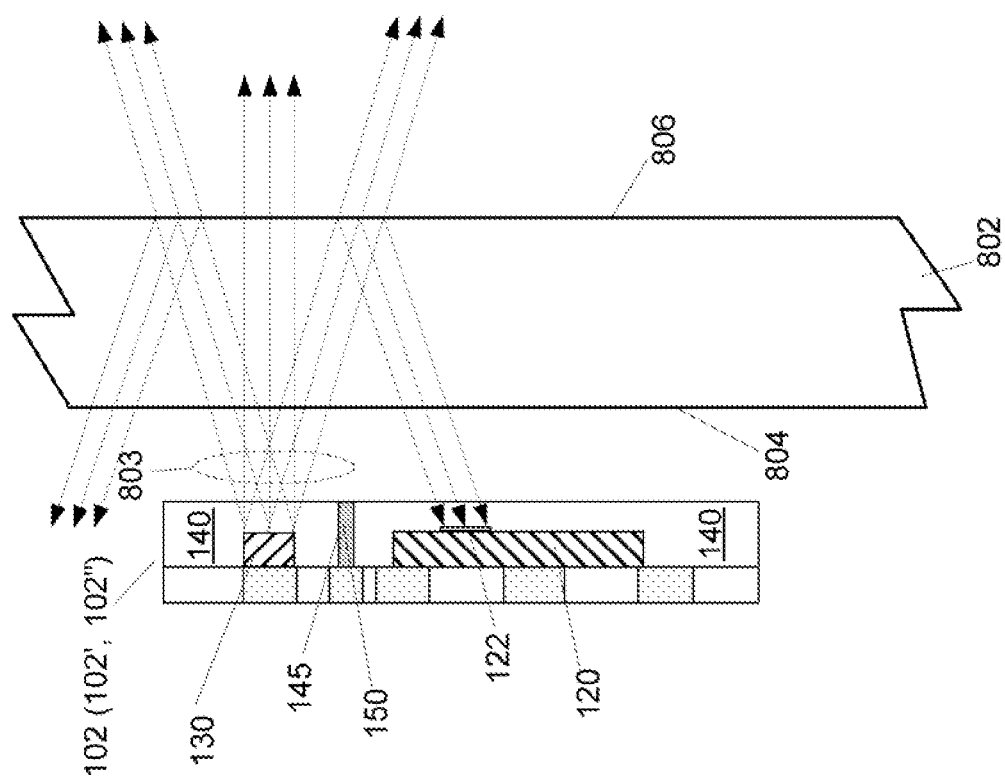

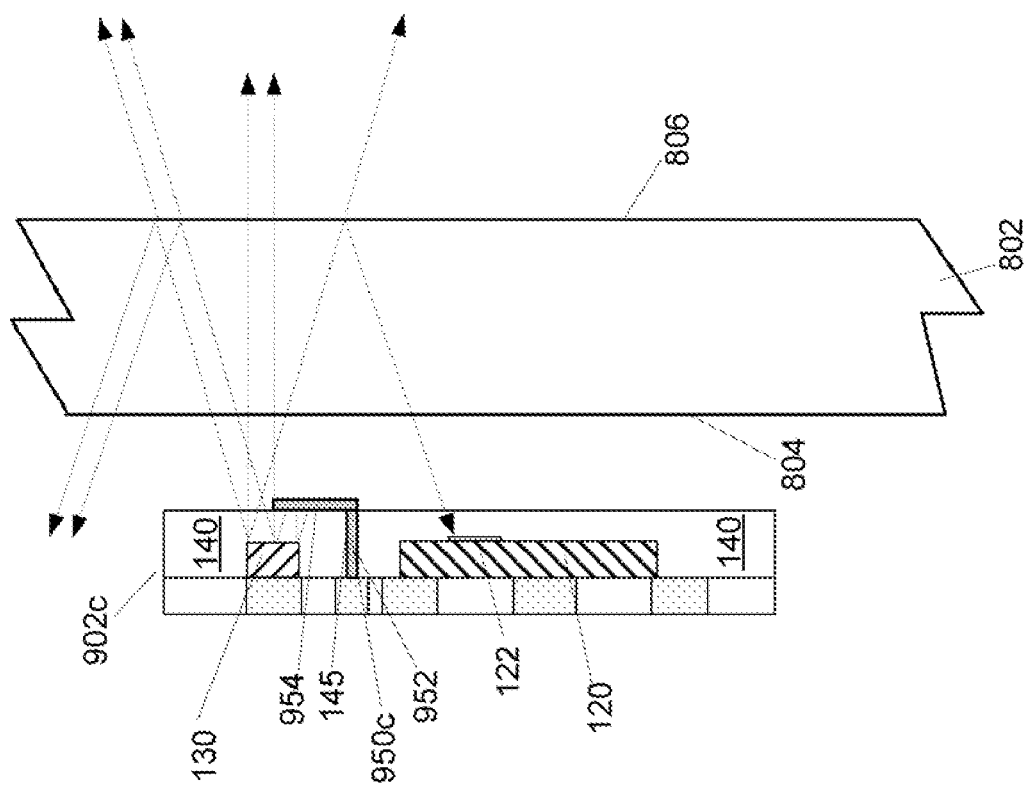

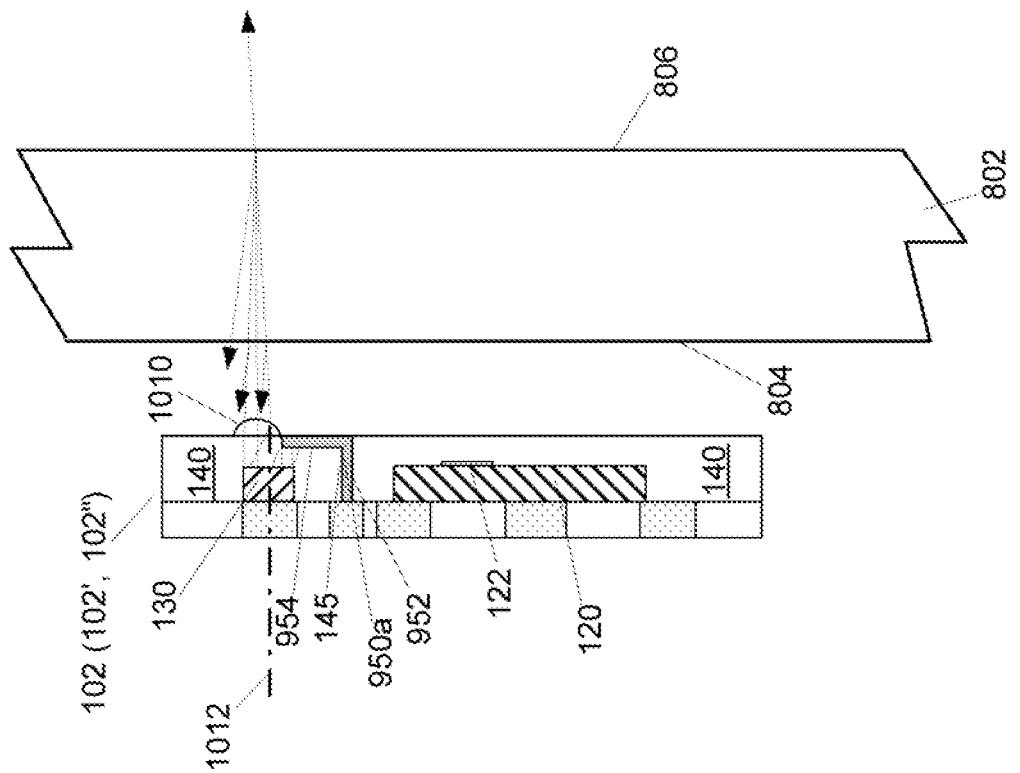

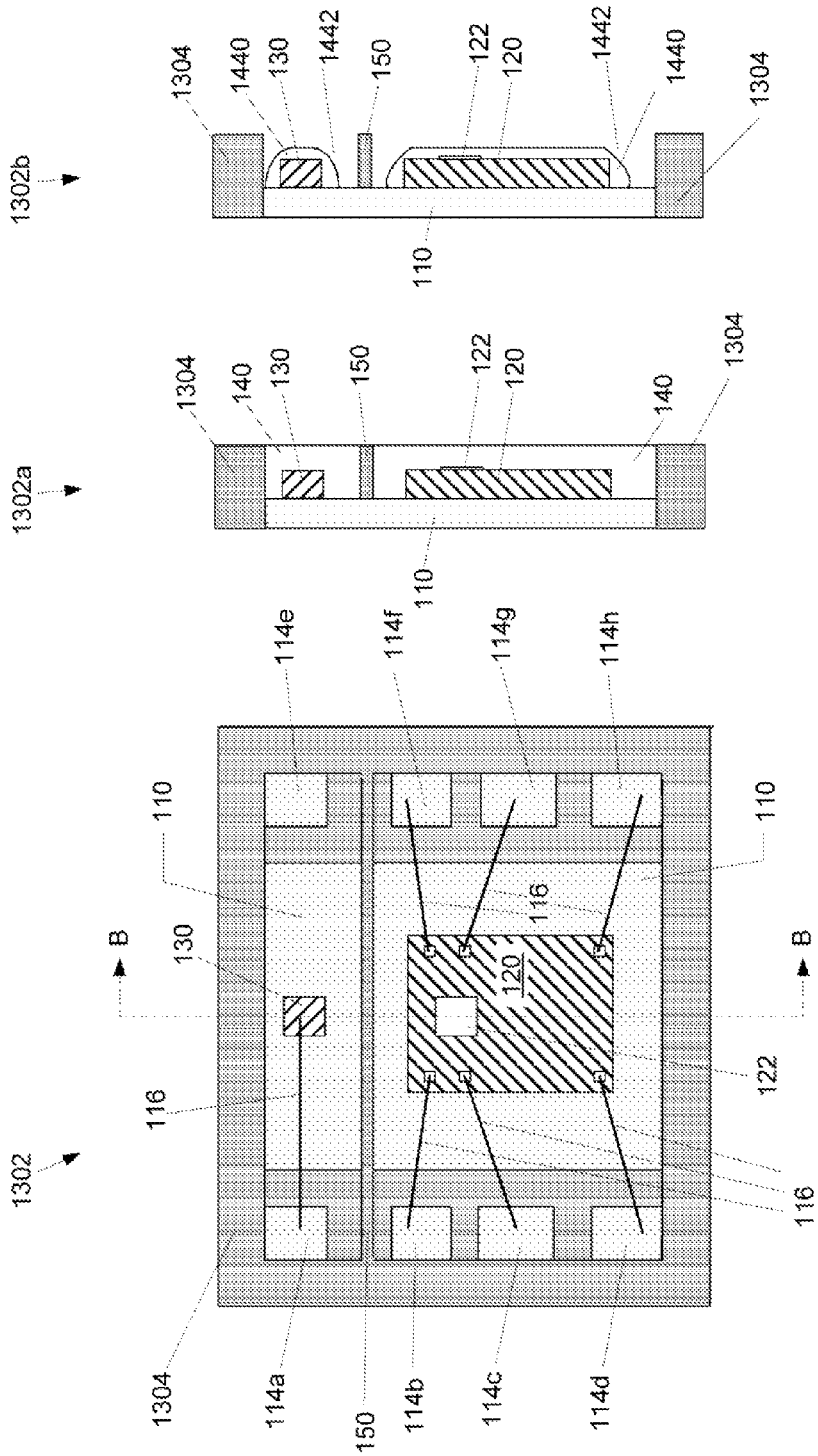

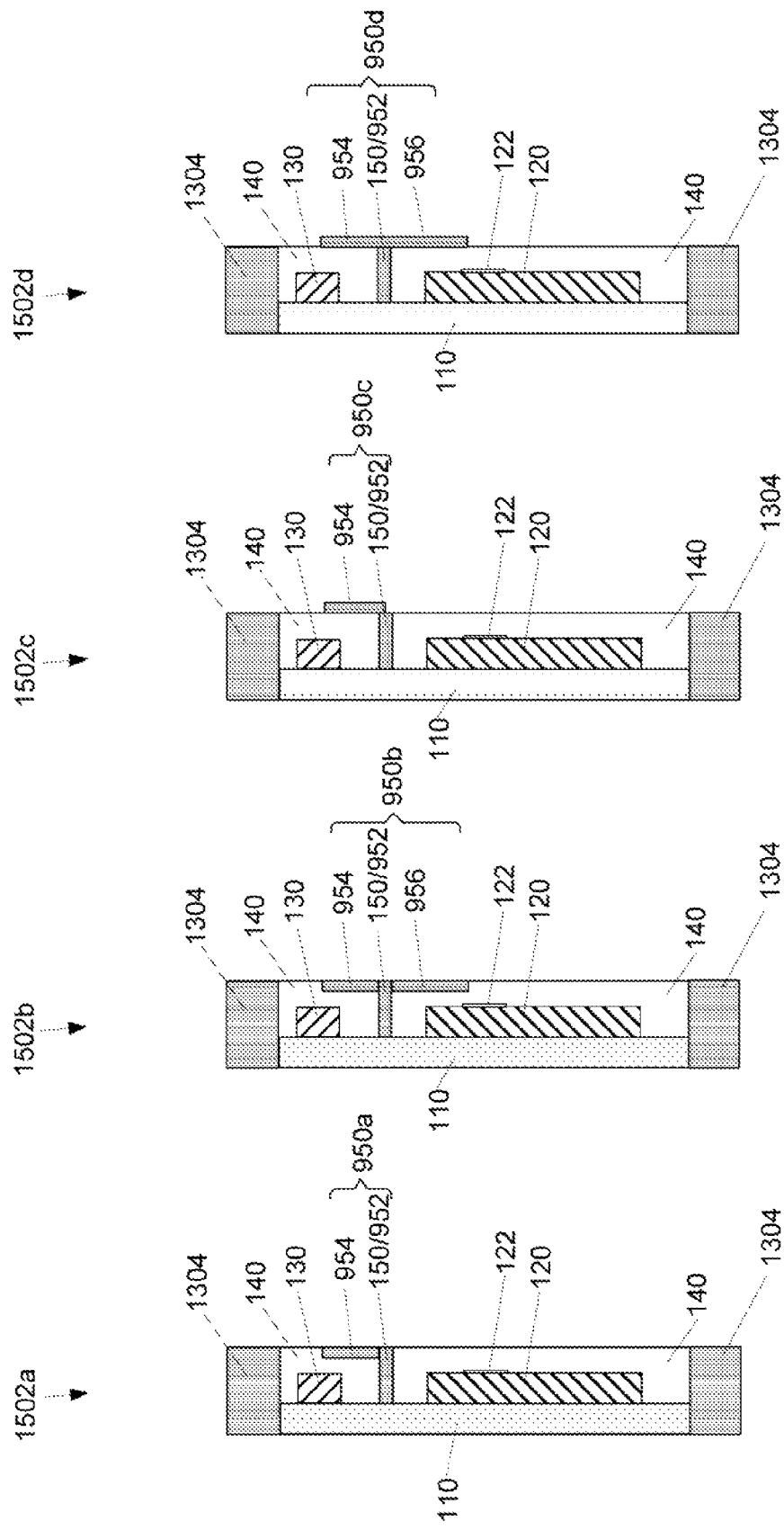

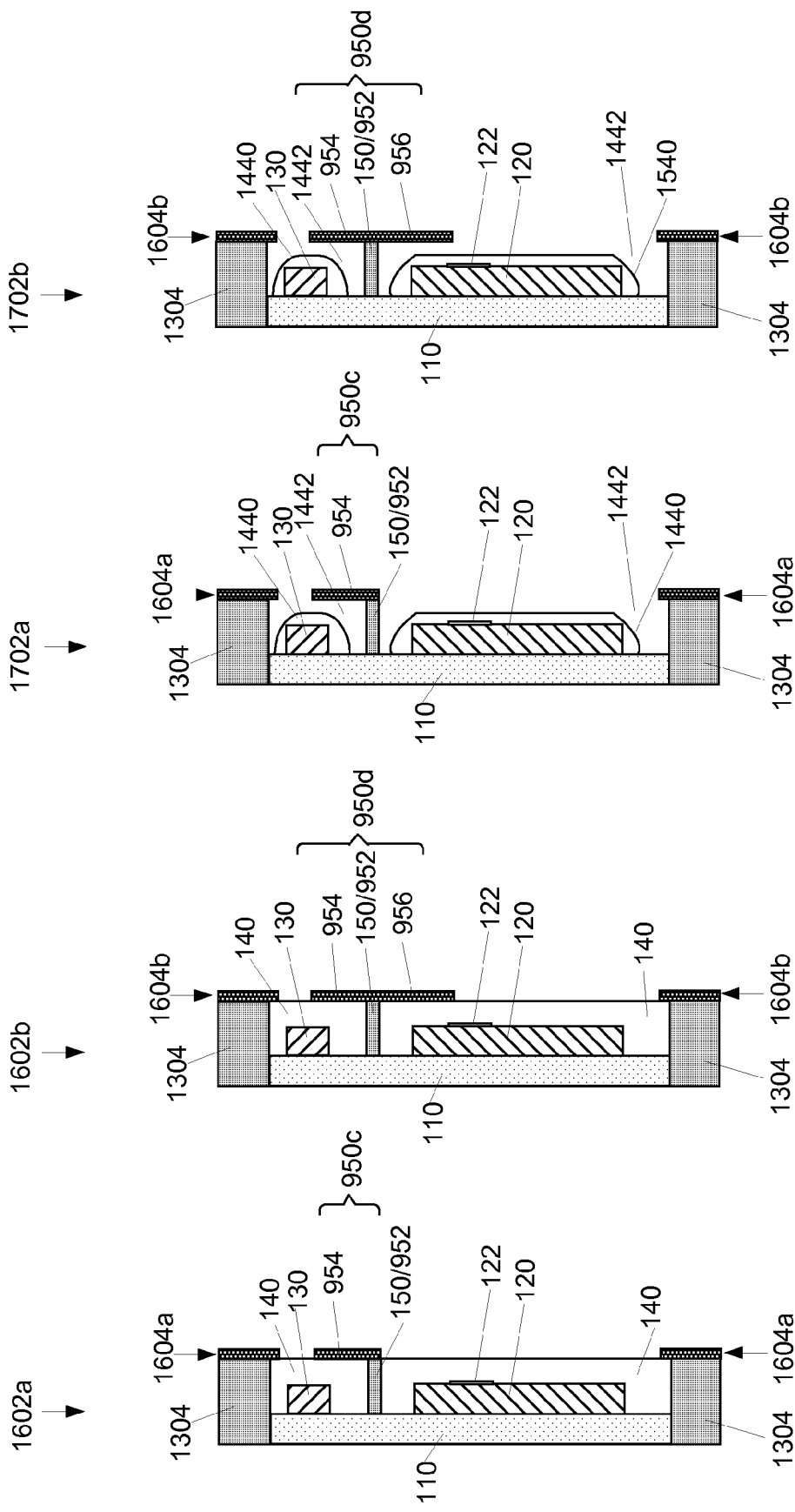

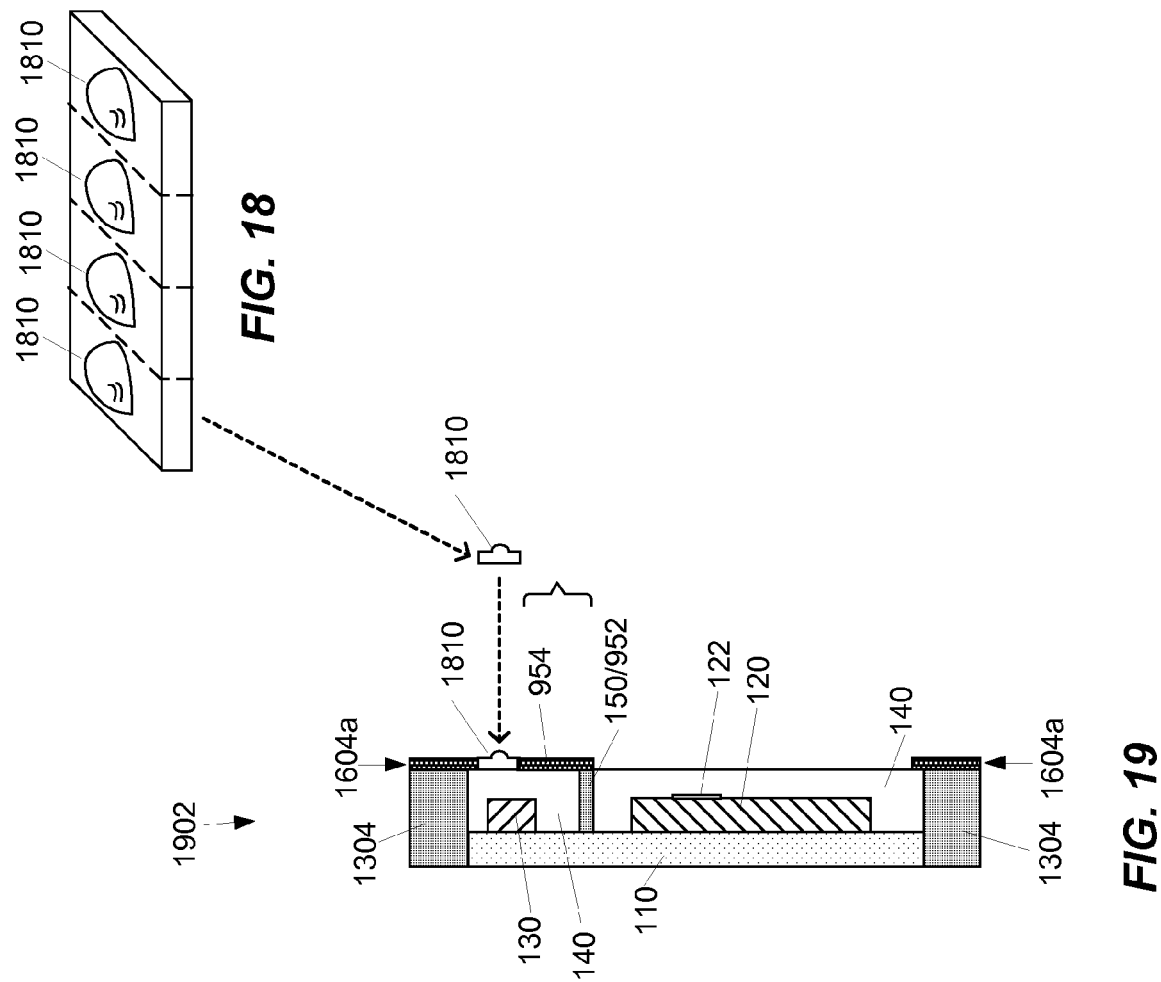

OPTICAL SENSORS THAT REDUCE SPECULAR REFLECTIONS

PRIORITY CLAIMS AND RELATED APPLICATION

This application is a continuation-in-part (CIP) of U.S. patent application Ser. No. 12/499,723, entitled OPTICAL SENSORS THAT REDUCE SPECULAR REFLECTIONS, filed Jul. 8, 2009, which is incorporated herein by reference.

This application claims priority under 35 U.S.C. 119(e) to U.S. Provisional Patent Application No. 61/263,307, entitled OPTICAL SENSORS THAT REDUCE SPECULAR REFLECTIONS, which was filed Nov. 20, 2009, U.S. Provisional Patent Application No. 61/218,867, entitled OPTICAL SENSORS THAT REDUCE SPECTRAL REFLECTIONS, which was filed Jun. 19, 2009, and U.S. Provisional Patent Application No. 61/169,236, entitled OPTICAL SENSORS AND METHODS FOR PROVIDING OPTICAL SENSORS, which was filed Apr. 14, 2009, each of which is incorporated herein by reference.

BACKGROUND

Optical sensors, such as optical proximity sensors, may include one or more light emitting elements (e.g., LEDs) and an adjacent photosensitive light detector, where the sensor can estimate proximity of an object based on the magnitude of reflected light from the one or more LEDs returning to the sensor. The value of these sensors has become more important in the recent past with the advent of battery-operated hand-held devices, such as mobile phones. For example, a fair amount of the energy from a mobile phone battery is used to drive the display, and there is value in turning off the display or backlight when the mobile phone or other device is brought to the user's ear (where it cannot be viewed anyway). Optical proximity sensors have been used for this, and many other applications.

For other examples, there are many other applications in which the presence of an object can be detected with an optical proximity sensor to advantage. These range from sensing when protective covers have been opened on machinery, paper has been positioned correctly in a printer, or an operator's hands are at risk near an operating machine. An optical proximity sensor can also be used as a simple touch or near-touch activated switch, and could be implemented in applications like keyboards or devices that have a plastic housing that is sealed but which allows the light from the source to pass through and be sensed by the detector on the return.

Light from the source to the detector that does not project out of the package to the target, but rather is transmitted directly from the source to the detector, reduces the capability of the overall device to sense distance. Such light essentially propagates sideways within the package and is considered noise or "light leakage", and contains no information. To reduce and preferably prevent light leakage, a light barrier is often used to isolate the light source from the light detector. However, current techniques for manufacturing optical proximity sensors are relatively complex, costly and often results in sensors that are larger than desired. Further, the optical proximity sensor components except the light source are often produced by one vendor, while the light source is produced by another vendor, resulting in the light source being installed separately from the rest of the components of the optical proximity sensor, which increases the overall footprint of the device, and the complexity and the cost of the assembly.

Optical sensors are often used with (e.g., placed behind or covered by) a cover plate that is glass, plastic, or some other protective light transmissive material. For example, the cover plate can be the glass covering a screen of a mobile phone, portable music player or personal data assistant (PDA), or the plastic covering a screen of a laptop computer. When such a cover plate is placed over an optical sensor, the optical sensor is often susceptible to specular reflections. Just as it is desirable to minimize light being transmitted directly from the source to the detector, it is also desirable to minimize the specular reflections because such reflections similarly reduce the capability of the overall device to sense distance, since specular reflections are essentially noise that contain no information.

SUMMARY

Many of the applications described above would benefit from a sensor of reduced form factor, with a simple structure that can be mass-produced at low cost. Embodiments of the present invention are believed to provide such simple and cost effective sensors. Further embodiments of the present invention reduce a sensor's susceptibility to specular reflections.

An optical sensor device, according to an embodiment of the present invention, includes a light source and a light detector. The light source can include one or more light emitting elements, and the light detector can include one or more light detecting elements. A first opaque light barrier portion, between the light source and the light detector, is configured to block light from being transmitted directly from the light source to the light detector. A second opaque light barrier portion, extending from the first opaque light barrier portion in a direction towards the light source, is configured to reduce an amount of specular reflections that would occur if a light transmissive cover plate were placed over the optical sensor device. In accordance with an embodiment of the present invention, a portion of the second opaque light barrier portion covers at least a portion of at least one of the one or more light emitting elements of the light source.

In an embodiment, the first opaque light barrier portion and the second opaque light barrier portion are separately formed. The first opaque light barrier portion and the second opaque light barrier portion can be generally perpendicular to one another. Further, a portion of the first opaque light barrier portion can be connected by an opaque epoxy to a portion of the second opaque light barrier portion so that light from the light source does not leak between the first and second opaque light barrier portions.

In an embodiment, the first opaque light barrier portion separates first and second cavities of the optical sensor device, with the light source located within the first cavity, and the light detector located within the second cavity. In such an embodiment, the second opaque light barrier portion covers a portion of the first cavity. In an embodiment, the first and second cavities can be substantially filled with a light transmissive material that covers the light source and the light detector. In such an embodiment, the second light barrier portion can be an opaque material that fills a trench formed in the light transmissive material covering the light source within the first cavity. Alternatively, the second light barrier portion can be an opaque material that is deposited on a portion of an outermost surface of the light transmissive material covering the light source within the first cavity. In still another embodiment, the second light barrier portion can be a portion of an aperture plate that covers a portion of an outermost surface of the light transmissive material covering the light source within the first cavity. Such an aperture plate can also be used where the cavities are not filled with the light transmissive material.

In accordance with an embodiment, an optical sensor device can include a further (e.g., third) opaque light barrier portion configured to reduce an amount of specular reflections that would be detected by the one or more light detecting elements of the light detector, if a light transmissive cover plate were placed over the optical sensor device. Such a third opaque light barrier portion extends from the first light barrier portion in a direction towards to the light detector. In an embodiment, a portion of the third opaque light barrier portion covers at least a portion of at least one of the one or more light detecting elements of the light detector. The third opaque light barrier portion can be formed in similar manners as the second opaque light barrier portion.

Embodiments of the present invention are also directed to methods for providing an optical sensor device. In accordance with an embodiment, first and second cavities are formed that are separated by a first opaque light barrier portion. A light source is attached within the first cavity and a light detector is attached within the second cavity so that the first opaque light barrier portion is between the light detector and the light source. Additionally, a second opaque light barrier portion is formed that extends from the first opaque light barrier portion, in a direction towards the first cavity. As was explained above, the second opaque light barrier portion is configured to reduce an amount of specular reflections, if a light transmissive cover plate were placed over the first and second cavities.

In accordance with an embodiment, before the second opaque light barrier portion is formed, the first and second cavities can be substantially filled with a light transmissive material so that the light transmissive material covers the light source and the light detector. The second opaque light barrier portion can then be formed by depositing an opaque material in a trench formed in the light transmissive material covering the light source within the first cavity. Alternatively, the second opaque light barrier portion can be formed by depositing an opaque material on a portion of an outermost surface of the light transmissive material covering the light source within the first cavity. In another embodiment, the second opaque light barrier portion is formed by covering a portion of an outermost surface of the light transmissive material with a portion of an aperture plate. An opaque epoxy can be used to attach a portion of the aperture plate to the portion of the outermost surface of the light transmissive material and to a portion of an outermost portion of the first opaque light barrier portion. Such an aperture plate can also be used where the cavities are not filled with the light transmissive material.

In accordance with an embodiment, a third opaque light barrier portion is formed that extends from the first opaque light barrier portion, in a direction towards the second cavity. The third opaque light barrier portion is configured to reduce an amount of specular reflections that would be detected by the light detector, if a light transmissive cover plate were placed over the first and second cavities.

Embodiments of the present invention are also directed to a device that includes a light source and a light detector. The device also includes a first opaque light barrier portion, between the light source and the light detector, which is configured to block light from being transmitted directly from the light source to the light detector. The device also includes a second opaque light barrier portion extending from the first opaque light barrier portion in a direction toward the light source. Additionally, the device includes a light transmissive cover placed over the light source and the light detector. In such embodiments, the second opaque light barrier portion is configured to reduce an amount of specular reflections caused by the light transmissive cover being placed over the light source. Additionally (or alternatively), the device can also include a further (e.g., third opaque) light barrier portion that extends from the first opaque light barrier portion, in a direction towards the second cavity. The third opaque light barrier portion is configured to reduce an amount of specular reflections detected by the light detector. Embodiments of the present invention are also directed to a system that includes the above described features, as well as additional features.

This summary is not intended to summarize all of the embodiments of the present invention. Further and alternative embodiments, and the features, aspects, and advantages of the embodiments of invention will become more apparent from the detailed description set forth below, the drawings and the claims.

BRIEF DESCRIPTION OF THE DRAWINGS

FIG. 1 a top view of an optical sensor device (e.g., a proximity sensor device), according to certain embodiments of the present invention.

FIG. 2A is a side view of the device of FIG. 1, according to a first embodiment of the present invention.

FIG. 2B is a cross-section of the device of FIGS. 1 and 2A, along dashed line B-B in FIG. 1, according to the first embodiment of the present invention.

FIG. 3A is a side view of the device of FIG. 1, according to a second embodiment of the present invention.

FIG. 3B is a cross-section view of the device of FIG. 1, along dashed line B-B in FIGS. 1 and 3A, according to the second embodiment of the present invention.

FIG. 4A is a side view of the device of FIG. 1, according to a third embodiment of the present invention.

FIG. 4B is a cross-section view of the device of FIGS. 1 and 4A, along dashed line B-B in FIG. 1, according to the third embodiment of the present invention.

FIG. 8 illustrates how an optical sensor can be placed behind a cover plate that can cause specular reflections.

FIG. 9C is a cross-section of an optical sensor device including a T-shaped barrier, according to an embodiment of the present invention.

FIG. 10 is a cross-section of an optical sensor device including an off-centered lens, according to an embodiment of the present invention.

FIG. 13 is a top view of an alternative optical sensor device (e.g., a proximity sensor device) that can benefit from embodiments of the present invention that reduce specular reflections.

FIGS. 14A and 14B are exemplary alternative cross-sections of the optical sensor shown in FIG. 13.

FIG. 15A is a cross-section of the optical sensor device of FIGS. 13 and 14A with the barrier modified to be an L-shaped barrier, according to an embodiment of the present invention.

FIG. 15B is a cross-section of the optical sensor device of FIGS. 13 and 14A with the barrier modified to be a T-shaped barrier, according to an embodiment of the present invention.

FIG. 15C is a cross-section of the optical sensor device of FIGS. 13 and 14A with the barrier modified to be an L-shaped barrier, according to an embodiment of the present invention.

FIG. 15D is a cross-section of the optical sensor device of FIGS. 13 and 14A with the barrier modified to be a T-shaped barrier, according to an embodiment of the present invention.

FIG. 16A is a cross-section of the optical sensor device of FIGS. 13 and 14A with the barrier modified to be an L-shaped barrier, according to an embodiment of the present invention.

FIG. 16B is a cross-section of the optical sensor device of FIGS. 13 and 14A with the barrier modified to be a T-shaped barrier, according to an embodiment of the present invention.

FIG. 17A is a cross-section of the optical sensor device of FIGS. 13 and 14B with the barrier modified to be an L-shaped barrier, according to an embodiment of the present invention.

FIG. 17B is a cross-section of the optical sensor device of FIGS. 13 and 14B with the barrier modified to be a T-shaped barrier, according to an embodiment of the present invention.

FIG. 18 is a perspective view of a plurality of lenses cast using a mold.

FIG. 19 is a cross-section of the optical sensor device that includes one of the lenses shown in FIG. 18.

DETAILED DESCRIPTION

Figure 5:
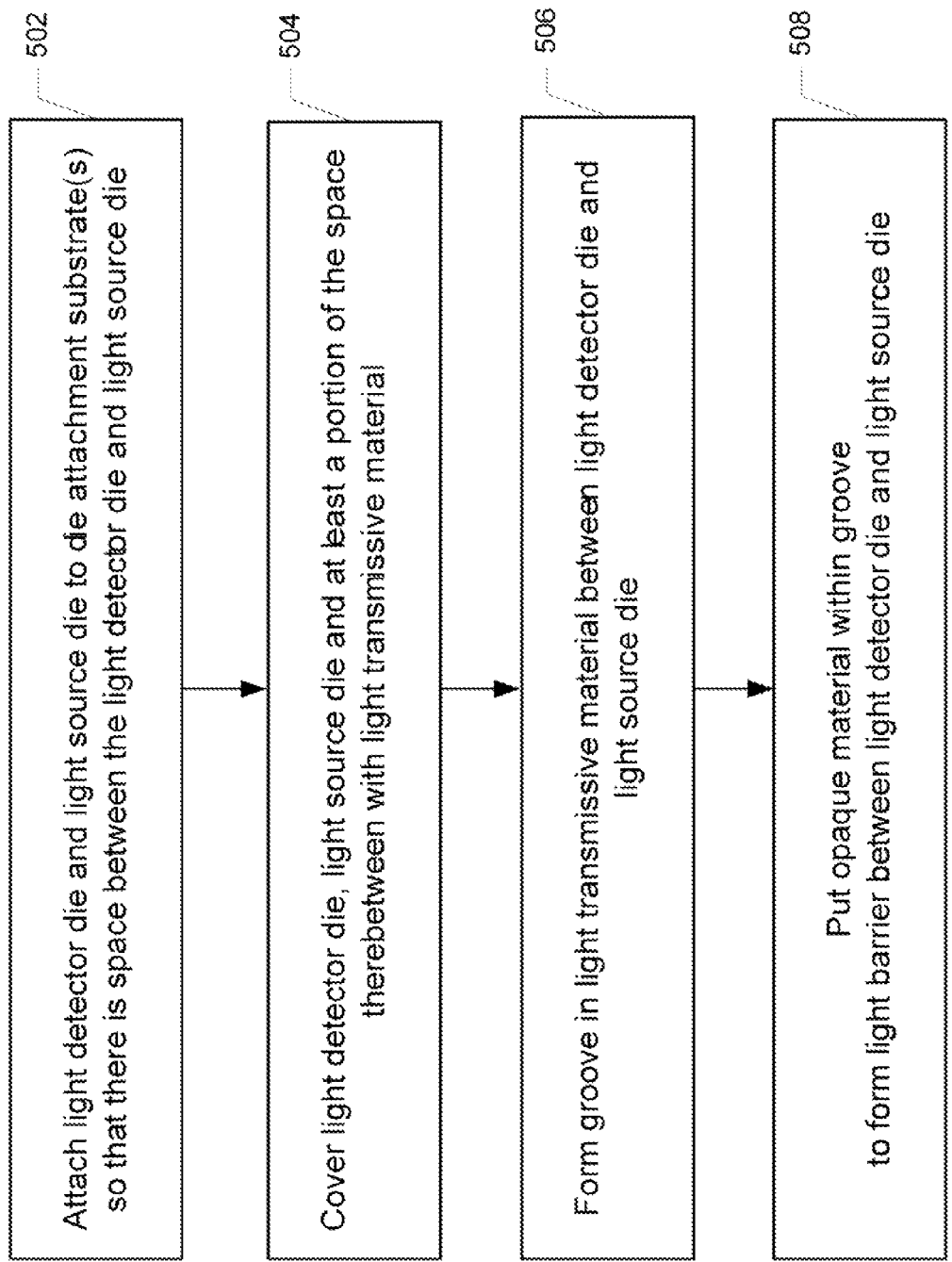
FIG. 5 is a high level flow diagram that is used to summarize various methods for providing an optical sensor device, in accordance with embodiments of the present invention.

FIG. 1 is a top view of an optical sensor device 102 (e.g., a proximity sensor device), according to specific embodiments of the present invention. FIG. 2A is a side view of the device 102 of FIG. 1, and FIG. 2B is a cross-section of the device 102 of FIGS. 1 and 2A (along dashed line B-B in FIG. 1), according to a first embodiment of the present invention.

As shown in FIG. 1, the optical sensor device 102 includes a die attachment substrate 110, which in FIG. 1 is shown as being a die attachment leadframe substrate, but can alternatively be a circuit board substrate, or a ceramic substrate, but is not limited thereto. A benefit of using one or more leadframes as the die attachment substrate(s) is that a leadframe substrate can typically be made thinner than a circuit board substrate or a ceramic substrate, which can reduce the overall thickness of the device 102, which may be desirable, depending on the application in which the device 102 is used. For example, a leadframe substrate can have a thickness of about 0.2 mm, whereas a circuit board substrate would likely have a thickness of at least 0.3 or 0.4 mm. Further, a leadframe substrate provides for better heat dissipation than a circuit board substrate. Additionally, a leadframe substrate, if metallic, is opaque to light, whereas a typical circuit board substrate is somewhat light transmissive (unless a black circuit board is used, which is difficult to obtain). Also, a leadframe substrate is typically less expensive than a circuit board substrate and a ceramic substrate.

Attached to the die attachment substrate 110 is a light detector die 120 and a light source die 130. The light detector die 120 (which can also be referred to as a photosensor die, a photodetector die or an optical detector die) includes one or more light detecting elements, such as, but not limited to, a photoresistors, photovoltaic cells, photodiodes, phototransistors, charge-coupled devices (CCD), or the like, that can be used to produce a current or voltage indicative of the magnitude of detected light. The one or more light detecting elements form an active area 122 of the light detector die 120. While an exemplary location of the active area 122 relative to the remainder of the light detector die 120 is shown in the FIGS., alternative locations for the active area 122 are also within the scope of the present invention. For example, the active area 122 can be located further from (or closer to) the light source die 130 than is shown in the FIGS.

The light source die 130 (which can also be referred to as a light emitter die) includes one or more light emitting elements, such as, but not limited to, light emitting diodes (LEDs), organic LEDs (OLEDs), bulk-emitting LEDs, surface-emitting LEDs, vertical-cavity surface-emitting lasers (VCSELs), superluminescent light emitting diodes (SLEDs), laser diodes, pixel diodes, or the like. An LED type light source die 130 can include, for example, an n-type Silicon substrate with a p-type layer (e.g., a Gallium Arsenide (GaAs) layer) deposited on the n-type Silicon substrate. An electrode attached to the p-type layer provides one of the terminals of the LED die, and another electrode attached to the n-type substrate provides the other terminal of the LED die. The electrode attached to the p-type layer can be, or can be attached to, a wire bond (e.g., the wire bond 116 attached to the top of the light source die 130 in FIG. 1). The electrode attached to the n-type substrate can be, e.g., a conductive (e.g., silver) epoxy. For example, the conductive epoxy can attach the bottom of the n-type substrate to a die attachment leadframe substrate (e.g., 110 in FIG. 1).

The die attachment leadframe substrate 110 is shown as including leadframe arms 112a and 112b, that extend from the main body of the die attachment leadframe 110, and which can increase the light blocking capability of a light barrier that is formed in manners explained below. Also shown are leadframe bond pads 114a-h, that are electrically isolated from the die attachment leadframe 110, and wire bonds 116 that attach the light detector die 120 and the light source die 130 to the bond pads 114a-h.

As best seen in FIGS. 2A and 2B, a light transmissive material 140 covers the light detector die 120, the light source die 130 and the die attachment substrate 110 (except where a groove 145, discussed below, is formed). In accordance with specific embodiments, the light transmissive material 140 can be a light transmissive epoxy (e.g., a clear epoxy), or other light transmissive resin or polymer that is molded (e.g., transfer molded or cast molded) or otherwise formed over the light detector die 120, the light source die 130 and the die attachment substrate 110. A groove 145 (which can also be referred to as a channel) is formed in the light transmissive material between the light detector die and the light source die. The groove 145 can be saw cut, blade cut, or laser cut, or cut in another manner. Alternatively, the groove can be formed (e.g., cast) using a feature in the mold that is used to form the light transmissive material over the dies 120 and 130 and the space therebetween. For example, the groove 145 can be formed by a thin fin machined to project from a mold surface.

Within the groove 145 is an opaque material 150 that provides a light barrier between the light detector die and the light source die. In accordance with specific embodiments, the opaque material can be an opaque epoxy (e.g., a black epoxy) or other opaque resin or polymer that does not allow the wavelength(s) of light produced by the light emitter die 130 to pass therethrough. In other words, the light barrier, formed by the opaque material 150 within the groove 145, prevents light produced by the one or more light emitting elements of the light source die 130 from being transmitted directly to and detected by the one or more light detecting elements of the light detector die 120.

In accordance with an embodiment, the groove 145 is formed in the light transmissive material 140 preferably such that the groove 145 extends to the die attachment substrate 110, as shown in FIGS. 2A and 2B. If the groove 145 does not extend all the way to the die attachment substrate 110, the groove 145 should still be deep enough such that when the groove is occupied by the opaque material 150, an adequate light barrier is provided between the light source die 130 and the light detector die 120.

Reference is now made to FIGS. 3A and 3B, which are side and cross sections views respectfully of the light sensor device 102', according to a second embodiment of the present invention. In this embodiment, a strip of opaque material 154 is formed on the die attachment substrate 110, and the groove 145 is formed in the light transmissive material 140 such that the groove 145 preferably extends to or in the strip of opaque material 154. The strip of opaque material 154 can comprise the same opaque material as material 150, or a different material. In this embodiment, the strip 154 forms part of the light barrier between the light source die 130 and the light detector die 120. The strip 154 can be deposited and cured prior to the light transmissive material 140 being cast or otherwise formed.

Reference is now made to FIGS. 4A and 4B, which are side and cross sections views respectfully of the light sensor device 102", according to a third embodiment of the present invention. In this embodiment, a groove 152 is formed in the die attachment substrate 110 below where the groove 145 is formed (or more accurately, is thereafter formed) in the light transmissive material 140. As shown in FIGS. 4A and 4B, a strip of opaque material 154 is within the groove 152 and extends above a planar surface of the die attachment substrate 110. As also shown, the groove 145 formed in the light transmissive material 140 preferably extends to or into the strip of opaque material 154. In this embodiment, the strip 154 forms part of the light barrier between the light source die 130 and the light detector die 120. The strip 154 can be deposited and cured prior to the light transmissive material 140 being cast or otherwise formed.

Still referring to FIGS. 4A and 4B, it is also possible that the strip 154 not be included, but that the groove 145 is formed in the light transmissive material 140 so that the groove 145 as adjacent and continuous with the groove 152 in the die attachment substrate 110, so that when the groove 152 is filled with the opaque material 140, the groove 152 in the substrate 110 is also filled with the same opaque material 140.

In the embodiments of FIGS. 2A and 2B, and 3A and 3B, if the groove 145 does not extend all the way to the strip 154 of opaque material, or all the way to the die attachment substrate 110, the groove 145 should still be deep enough such that when occupied by the opaque material 150, an adequate light barrier is provided between the light source die 130 and the light detector die 120.

In the embodiments described above, the optical devices 102, 102' and 102" were shown as including a single die attachment substrate to which both the light detector die 120 and the light source die 130 are attached. In alternative embodiments, the optical devices 102, 102' and 102" can include more then one die attachment substrate, e.g., such that the light detector die 120 is attached to one die attachment substrate and the light source die 130 is attached to another (e.g., an adjacent) die attachment substrate. In such embodiments, the groove 145 should still be formed between the light detector die 120 and the light source die 130.

In accordance with an embodiment, the resulting sensor devices 102, 102' and 102" are dual row flat no lead (DFN) devices, as can be seen from FIGS. 2A, 3A and 4A. In FIGS. 2A, 3A and 4A, the exposed leadframe bond pads 114 enable the sensor devices to be connected to other circuitry. Alternatively, other pads, pins, ball grids, or the like, can be provided to enable the optical sensors 102, 102' and 102" to be connected to other circuitry, as is well known in the art.

In each of the above described embodiments, the light transmissive material 140 can have shallow optical structures cast or otherwise formed therein to direct the emission of the light, as well as to direct or restrict the acceptance angle of the detector die. The optical structures may include, but are not limited to, small prisms, diffusers, smooth flat surfaces, lenses, shutters, or holographic elements, as well as combinations of these. For example, the optical structures could be machined into a surface of a mold and replicated in a light transmissive material which is cast or otherwise formed using the mold.

The high level flow diagram of FIG. 5 will now be used to describe methods for providing an optical sensor, in accordance with various embodiments of the present invention. Referring to FIG. 5, at step 502, a light detector die (e.g., 120) is attached to a die attachment substrate (e.g., 110) and a light source die (e.g., 130) is attached to the same die attachment substrate to which the light detector die is attached, or to another die attachment substrate, so that there is a space between the light detector die and the light source die. The dies 120 and 130 can be attached to the die attachment substrate 110, e.g., using an epoxy, which depending upon implementation, can be a non-conducting or a conducting (e.g., a silver filled) epoxy. Other attachment techniques are also possible, and within the scope of the present invention.

At step 504, the light detector die, the light source die and the space between the light detector die and the light source die are covered with a light transmissive material (e.g., 140). This can be accomplished by covering the entire side of the substrate(s), to which the dies are attached, with the light transmissive material. As explained above, the light transmissive material can be can be a clear or other light transmissive epoxy or other resin or polymer. The light transmissive material can be formed, e.g., using cast molding or transfer molding, but is not limited thereto.

At step 506, a groove (e.g., 145) is formed in the light transmissive material between the light detector die and the light source die. As explained above, the groove can be formed by saw cutting, blade cutting or laser cutting, but is not limited thereto. Alternatively, the groove can be formed (e.g., cast) by a feature in a mold used to form the light transmissive material over the dies 120 and 130 and the space therebetween. For example, the groove 145 can be formed by a thin fin machined to project from a mold surface.

Where the groove is formed by cutting into the light transmissive material, the entire space between the light detector die and the light source die can be covered with the light transmissive material at step 504, which will thereafter be cut into at step 506. Where the groove is formed by a feature in a mold, a portion of the space between the light detector die and the light source die will not be covered by the light transmissive material (due to the feature in the mold), with such portion forming the groove.

At step 508, an opaque material (e.g., 150) is put within the groove to form a light barrier between the light detector die and the light source die. As explained above, the opaque material can be, e.g., an opaque epoxy, such as a black epoxy, or some other resin or polymer that is opaque to the wavelength(s) of light of produced by the light emitter die 130. In this manner the formed light barrier prevents light produced by the one or more light emitting elements of the light source die (e.g., 130) from being transmitted directly to and detected by the one or more elements that detect light of the light detector die (e.g., 120).

The opaque material can be placed within the groove in a precise and controlled manner, or can be spread over the entire surface of the light transmissive material to fill the groove and the excess can be wiped or otherwise cleaned away, similar to how tile is grouted. The opaque material can be squirted or otherwise dispensed, e.g., using positive pressure from an applicator (e.g., similar to a hollow needle) to fill or substantially fill the groove in a single pass or a multi-pass process, and excess opaque material can be wiped away or otherwise removed. For example, an automated dispensing system, such as those available from Asymtek of Carlsbad, Calif., can be used to dispense the opaque material. Other techniques can also be used and are within the scope of the present invention.

In specific embodiments, the opaque material fills or at least substantially fills the groove, preferably in a manner that prevents or minimizes the amount air bubbles therein, to maximize the opaqueness of the formed light barrier. In an embodiment the channel can be filled with the opaque material, and then the material can be cured so that air bubble collapse. Thereafter, one or more further layer/coating of the opaque material can be applied to fill in a dent or well that results after the air bubbles collapse.

After step 502, but before steps 504, 506 and 508, wire bonding or the like can be performed to connect the dies (e.g., 120 and 130) to bond pads (e.g., 114). Prior to steps 504, 506 and 508 (and either before or after step 502), a strip of opaque material (e.g., 154) can be formed on the die attachment substrate, as was described above with reference to FIGS. 3A, 3B, 4A and 4B, to allow for some slop (i.e., to increase the tolerance) of the depth control when saw, blade or laser cutting the groove in light transmissive material (e.g., 140), while still allowing for a complete optical barrier so long as the groove is cut such that it extends to or into the strip of opaque material. Such a strip of opaque material (e.g., 154) can be formed, e.g., using an automated dispensing system, such as those available from Asymtek of Carlsbad, Calif. Also, as was discussed above with reference to FIGS. 4A and 4B, a groove (e.g., 152) can be formed in the die attachment substrate 110 (e.g., etched into the substrate 110), and the groove may or may not be covered with a strip of opaque material (e.g., 154). The groove (e.g., 152) can also be used to increase the tolerance in the groove cut depth.

Figure 6:
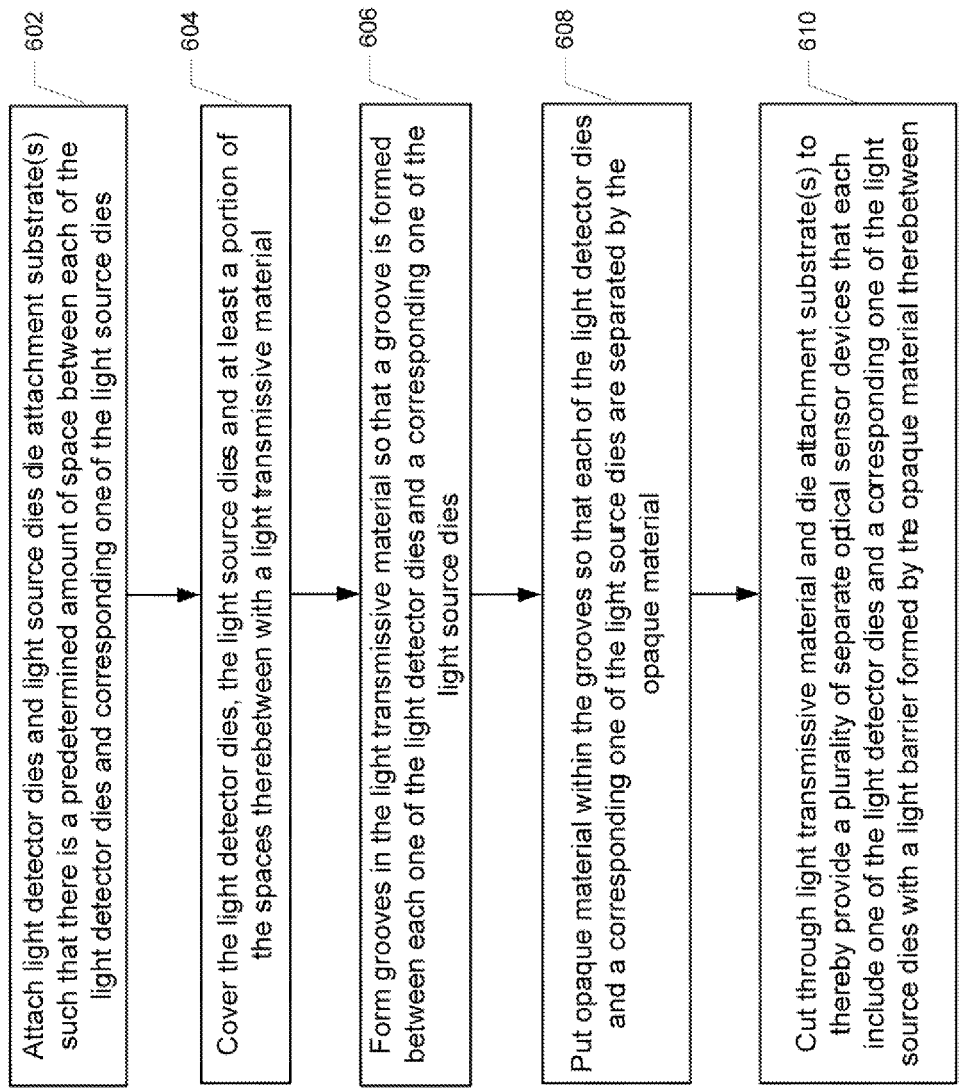
FIG. 6 is a high level flow diagram that is used to summarize various methods for providing a plurality of optical sensor devices, in accordance with embodiments of the present invention.

An advantage of certain embodiments of the present invention is that a plurality of optical sensors can be produced in a cost and time effective manner, as will now be summarized with reference to the high level flow diagram of FIG. 6. Referring to FIG. 6, at step 602, a plurality of light detector dies and a plurality of light source dies are attached to one or more die attachment substrates such that there is a predetermined amount of space between each one of the light detector dies and a corresponding one of the light source dies. For example, 1000 light detector dies and 1000 corresponding light source dies can be attached to a 2×6 inch leadframe die attachment substrate in rows and columns (e.g., 20 rows×50 columns) such that there is a predetermined amount of space (e.g., 1 mm) between each one of the light detector dies and a corresponding one of the light source dies.

At step 604, the light detector dies, the light source dies and at least a portion of the spaces therebetween are covered with a light transmissive material, using one of the techniques described above with reference to step 504. For example, all of the dies and the spaces therebetween can be covered using the same molding process at the same time. This can be accomplished by covering the entire side of the substrate(s), to which the dies are attached, with the light transmissive material.

At step 606, grooves in the light transmissive material are formed so that a groove is formed between each one of the light detector dies and the corresponding one of the light source dies. As was explained above, saw, blade or laser cutting, or the like, can be used to form such grooves. Where the light detector dies and the light source dies are attached in rows and columns, relatively few cuts would need to be made to form the grooves between all of the light sources and the corresponding light detectors. For example, where there are 20 rows×50 columns of die pairs (where a die pair is one of the light detector dies and a corresponding one of the light source dies), as few as 20 cuts would need to be made to form the grooves for all 1000 die pairs. The precise number of cuts would depend on the arrangement of the die pairs on the die attachment substrate(s). As was explained above, features of a mold (used to form the light transmissive material over the dies) can alternatively be used to form the grooves. Where the light detector dies and the light source dies are attached in rows and columns, relatively few mold features would be needed to form the grooves between all of the light sources and the corresponding light detectors. For example, where there are 20 rows×50 columns of die pairs, as few as 20 thin fins machined to project from a mold surface can be used to form the grooves for all 1000 die pairs. The precise number of mold features would depend on the arrangement of the die pairs on die attachment substrate(s).

Where the grooves are formed by cutting into the light transmissive material, the entire space between each die pair can be covered with the light transmissive material at step 604, which will thereafter be cut into at step 606. Where the grooves are formed by features of a mold, a portion of the space between each die pair will not be covered by the light transmissive material (due to a feature in the mold), with such portion forming the groove.

At step 608, an opaque material (e.g., 150) is put within the grooves to form a light barrier between each one of the light detector dies and the corresponding one of the light source dies. Exemplary techniques for putting the opaque material within the grooves is provided above in the discussion of step 508. If a precision dispensing machine were used to dispense the opaque material into the grooves, relatively few passes of the dispensing machine would be needed to fill the grooves between all of the light sources and the corresponding light detectors. For example, where there are 20 rows×50 columns of die pairs, as few as 20 passes of the dispensing machine can be used to fill the grooves for all 1000 die pairs. The precise number of passes would depend on the arrangement of the die pairs on die attachment substrate(s).

After step 602, but before steps 604, 606 and 608, wire bonding or the like can be performed to connect the dies to bond pads (e.g., 114). Prior to steps 604, 606 and 608 (and either before or after step 602), strips of opaque material (e.g., 154) can be formed on the die attachment substrate(s), as was described above with reference to FIGS. 3A, 3B, 4A and 4B, to allow for some slop (i.e., to increase the tolerance) of the depth control when saw, blade or laser cutting the groove in light transmissive material (e.g., 140), while still allowing for a complete optical barrier so long as the grooves are cut such that it extends to or into the strip of opaque material. Where the light detector dies and the light source dies are attached in rows and columns, relatively few strips would need to be formed. For example, where there are 20 rows×50 columns of die pairs, as few as 20 strips of opaque material would need to be formed for all 1000 die pairs. The precise number of strips would depend on the arrangement of the die pairs on the die attachment substrate(s). Also, as was discussed above with reference to FIGS. 4A and 4B, grooves (e.g., 152) can be formed in the die attachment substrate(s) 110 (e.g., etched into the substrate 110), and the grooves may or may not be covered with strips of opaque material (e.g., 154), to increase the tolerance in the groove cut depth. Where the light detector dies and the light source dies are attached in rows and columns, relatively few grooves in the die attachment substrate(s) would need to be formed. For example, where there are 20 rows×50 columns of die pairs, as few as 20 grooves in the die attachment substrate(s) would need to be formed for all 1000 die pairs.

The optical sensors described above can provide proximity sensing capabilities, as well as other capabilities, such as, but not limited to, ambient light detection. For example, the light detector die 120 can include circuitry to detect ambient light when the optical sensor is not being used to detect proximity. The light detector die 120 may also include circuitry to discriminate between light emitted from the light source die 130 that was reflected back toward the light detector die and ambient light, e.g., produced by the sun or an artificial light source intended to light a room.

Figure 7:
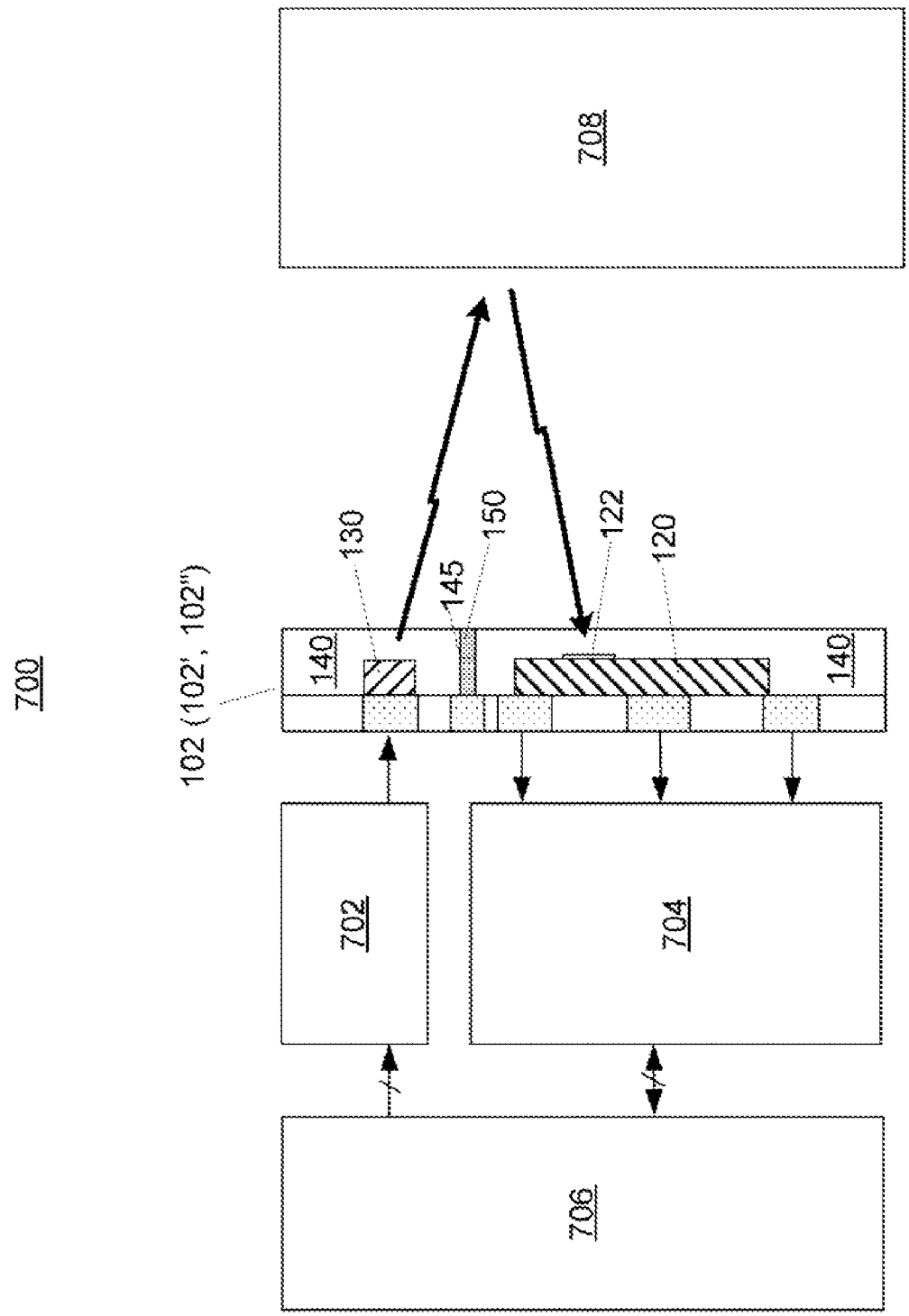
FIG. 7 is a high level block diagram of a system that includes an optical sensor of an embodiment of the present invention.

The optical sensors 102, 102' and 102" described above can be used in various systems, including, but not limited to, mobile phones, portable computers, portable video players, handheld devices, and the like. Referring to a system 700 shown in FIG. 7, for example, an optical sensor 102, 102' or 102" can be used as a proximity sensor to control whether a subsystem 706 (e.g., a touch-screen, display, backlight, virtual scroll wheel, virtual keypad, navigation pad, etc.) is enabled or disabled. For example, the optical sensor 102, 102' or 102" can detect when an object 708, such as a person's finger, is approaching, and based on the detection either enable (or disable) a subsystem 706.

When used as a proximity sensor, light emitted from the light emitting element(s) of the light source die 130 (or at least a portion of such light) will be reflected by an object (e.g., 708) when there is any, and be received by the light detector element(s) of light detector die 120. The light detector die 120 can convert the reflected light (and potentially also ambient light) to a current, and a resistor and/or other component(s), e.g., a transimpedance amplifier, can be used to convert such a current to a voltage. The intensity of the reflected light received by the light source die 120 is generally decreased at a rate of about $1/(4*X^2)$, where X is the distance between the object 708 and the sensor 102, 102' or 102". However, as just mentioned, the total light received can also includes ambient light, which may be from sun light, halogen light, incandescent light, fluorescent light, etc. Various techniques can be used to filter or separate out the ambient light response, some examples of which are disclosed in U.S. patent application Ser. No. 12/101,047, entitled PROXIMITY SENSORS AND METHODS FOR SENSING PROXIMITY, filed Apr. 10, 2008, which is incorporated herein by reference.

The system 700 can include one or more drivers 702 (e.g., an LED driver or laser driver) that drives the light emitting elements of the light source die 130. One or more output of the optical sensor 102, 102' or 102", which is indicative of detected light, can be provided to a processor and/or circuitry 704, e.g., which can include one or more comparators. The processor and/or circuitry 704 can, for example, compare the output(s) of the sensor 102, 102' or 102" to one or more thresholds to determine whether the object is within a range where the subsystem 706 should be enabled (or disabled, depending on what is desired), or to determine whether a touch key (e.g., of a touch keyboard) has been pressed. Multiple thresholds can be used, and more than one possible response can occur based on the detected proximity of an object. For example, a first response can occur if an object is within a first proximity range, and a second response can occur if the object is within a second proximity range. Other responses to the proximity of an object are also possible. The system 700 can additionally, or alternatively, use the optical sensor (e.g., 102, 102' or 102") to detect transient motion of an object, which is useful to distinguish a stationary object (e.g., a chair) within the range of the sensor from a non-stationary object. Time multiplexing and/or filtering may also be used so that the optical sensor 102, 102' or 102" can also be used as an ambient light sensor. When used as an ambient light sensor, the optical sensor 102, 102' or 102" can be used, e.g., to control the brightness of a display, to control the lighting within a room or other space, etc. These are just a few exemplary uses of the optical sensors 102, 102' and 102", which are not meant to be all inclusive.

Referring now to FIG. 8, optical sensors (e.g., 102, 102' and 102") may be used with (e.g., placed behind or covered by) a cover plate 802, which can be made, e.g., of glass, plastic, or some other protective light transmissive material. Such a cover plate 802 includes a close surface 804 and a far surface 806, with a thickness of the plate 802 therebetween. While the close surface 804 is shown as being a distance from the top surface of the optical sensor (e.g., 102, 102' or 102"), it is also possible that the close surface is in contact with (i.e., abuts against) the top surface of the optical sensor. The cover plate 802 can be, e.g., the glass covering a screen of a mobile phone, personal music player or personal data assistant (PDA), or the plastic covering the screen of a laptop computer, but is not limited thereto.

Exemplary light rays 803 are also shown in FIG. 8. As can be appreciated from FIG. 8, at least some of the light rays, or portions thereof, can be reflected back toward the active area 122 of the light detector die 120 due to specular reflections. Just as it is desirable to minimize light being transmitted directly from the source to the detector, it is also desirable to minimize the specular reflections because such reflections similarly reduce the capability of the overall device to sense distance since they are essentially noise that contain no information. To reduce and preferably prevent the detection of specular reflections by the light detector die 120 (and more specifically, by the active area 122 of the light detector die 120), alternative light barriers can be used, in accordance with certain embodiments of the present invention, as will be described below.

Figure 9A:
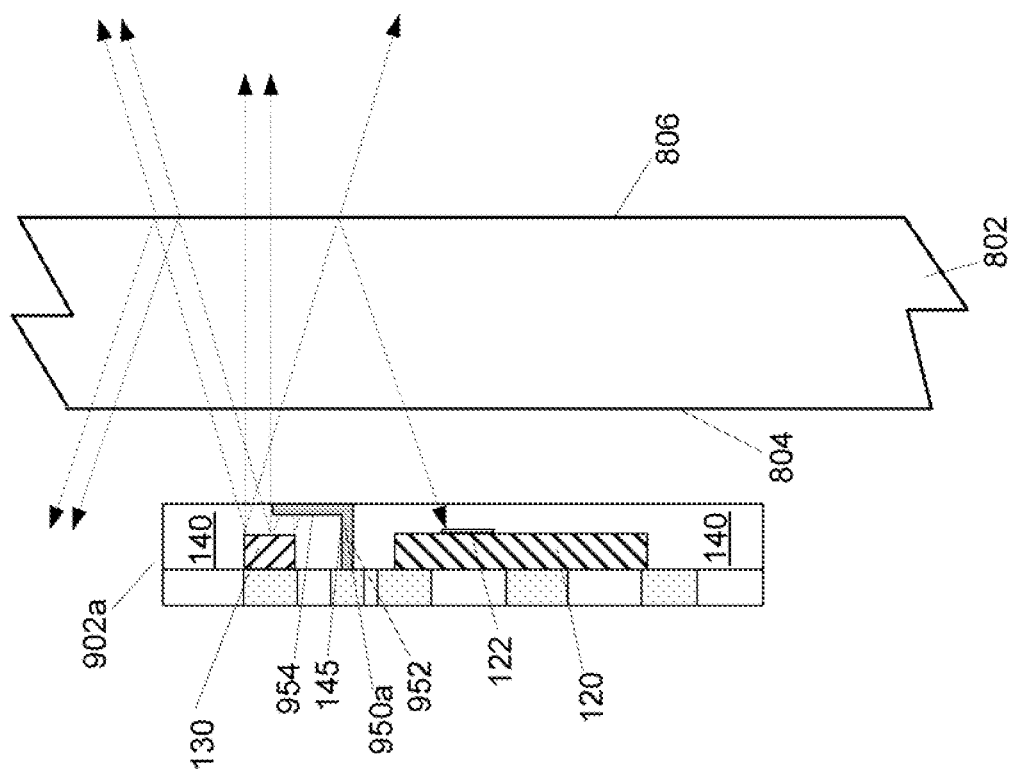
FIG. 9A is a cross-section of an optical sensor device including an L-shaped barrier, according to an embodiment of the present invention.

Referring to FIG. 9A, in accordance with an embodiment of the present invention, a light barrier 950a includes a first portion 952 (similar to barrier 150) that prevents light produced by the light source die 130 from travelling directly to the light detector die 120, in the same manner as did light barrier 150. Additionally, the light barrier 950a includes a second portion 954 that reduces specular reflections. This second portion 954, which extends from the first portion, forms a shelf over the light source die 120, and in an embodiment, covers at least a portion of a light emitting element(s) of the light source die 120, as shown in FIG. 9. As also shown in FIG. 9A, the light barrier 950a can be considered "L-shaped"

because the first and second portions 952 and 954 collectively resemble the letter "L". In specific embodiments, the second portion 954 of the light barrier 950a is perpendicular to the first portion 952.

As can be appreciated from a comparison between FIG. 8 and FIG. 9A, the second portion 954 of the light barrier 950a reduces the amount of specular reflections, and thereby reduces (and preferably minimizes) the amount of light detected by the active area 122 of light detector die 120 that would otherwise be due to specular reflections, if the sensor is used with a cover plate (e.g., 802). In this manner, the second portion 954 of the light barrier 950a increases the sensitivity of the sensor 902a. Stated another way, the second portion 954 of the light barrier 950a increases the percentage of light that will be detected by the active area 122 of light detector die 120 that is actually due to reflections by an object on the far side of the cover plate 802 (as opposed to reflections from the cover plate 802 itself).

Figure 9B:
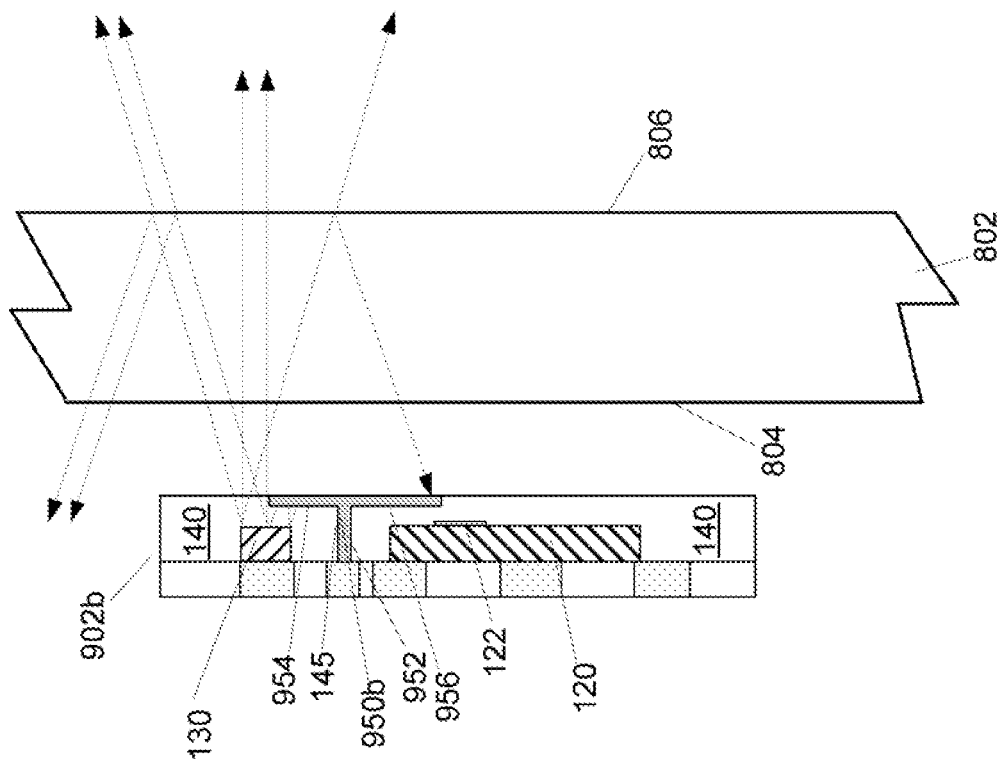
FIG. 9B is a cross-section of an optical sensor device including an L-shaped barrier, according to another embodiment of the present invention.

Referring to FIG. 9B, in accordance with an embodiment of the present invention, a light barrier 950b includes the first portion 952 (similar to barrier 150), the second portion 954 (that reduces specular reflections in the same manner described with reference to FIG. 9A), and a third portion 956 that reduces the detection of specular reflections. This third portion 956 forms a shelf over the light detector die 130, and in an embodiment, covers at least a portion of the active area 122, as shown in FIG. 9B. As also shown in FIG. 9B, such a light barrier 950b can be considered "T-shaped" because the first, second and third portions 952, 954 and 956 collectively resemble the letter "T". In specific embodiments, the second portion 952 and the third portion 954 of the light barrier 950b are each perpendicular to the first portion 952. In another embodiment, a barrier includes the portion 952 and 956, but not the portion 952, in which case, the barrier could be L-shaped.

As can be appreciated from a comparison between FIG. 8 and FIG. 9B, the third portion 956 of the light barrier 950b reduces the amount of specular reflections that are detected by the active area 122 of the light detector die 120, and thereby, increases the sensitivity of the sensor. Stated another way, the third portion 956 of the light barrier 950b blocks at least some specular reflections that would otherwise be detected by the active area 122 of the light detector die 120 if the third portion 956 were not included.

The L-shaped light barrier 950a, or the T-shaped light barrier 950b, can be used in place of the barrier 150 shown in any of the previously discussed FIGS., and thus can be used with or without the groove 152 (formed in the die attachment substrate 110) and/or the strip of opaque material 154 (formed below the barrier). The L-shaped light barrier 950a, or the T-shaped light barrier 950b, can be at least partially formed during steps 506 and 508 (or steps 606 and 608). For example, at step 506 (or step 606), before, after or while the groove (e.g., 145) is formed in the light transmissive material between the light detector die and the light source die (e.g., by saw cutting, blade cutting or laser cutting) an adjacent shallow groove can also be formed on one side (or both sides) of the groove 145, where the adjacent groove(s) have the desired dimensions of the second and/or third portions 954 and/or 956. Alternatively, where a mold is used, the groove 145 corresponding to the first portion 952, and an adjacent groove corresponding to the second portion 954 (and optionally also another adjacent groove corresponding to the third portion 956) of the barrier 950a (or 950b) can be formed by corresponding features of the mold. The forming of the barrier 950a (or 950b) can be completed at steps 508 or 608 when the opaque material is put within the formed groove(s).

In FIGS. 9A and 9B, the outermost surface of the second portion 954 (and optionally also the third portion 956) of the light barrier 950a (or 950b) is shown as being substantially flush with the outermost (i.e., top) surface of the light transmissive material 140. Referring now to the sensors 902c and 902d of FIGS. 9C and 9D, in alternative embodiments, the first portion 952 of the barrier 950c (or 950d) can be formed in the same manner that the barrier 150 was formed, as described above, and the second portion 954 (and optionally also the third portion 956) can be formed above the outermost (i.e., top) surface of the light transmissive material 140. The same opaque material used to form the first portion 952 of the barrier can be used to form the second portion 954 (and optionally also the third portion 956), or a different opaque material can be used. The second portion 954 (and optionally also the third portion 956) of the barrier 950c (or 950d) can be formed above the outermost (i.e., top) surface of the light transmissive material 140 in a single or multi-pass process, e.g., using an automated dispensing system, such as those available from Asymtek of Carlsbad, Calif., and/or using a mask (similar to a lithography mask) or screen (similar to a silk screen), but is not limited thereto. In other words, the second portion 954 (and optionally also the third portion 956) of the barrier 950c (or 950d) can essentially be painted or otherwise deposited in the desired pattern onto the outermost (i.e., top) surface of the light transmissive material 140, with portions of the pattern overlapping the outermost (i.e., top) surface of the first portion 952 of the barrier 950c (or 950d). In such embodiments, the second portion 954 (and optionally also the third portion 956) still extend from the first portion 952.

Figure 9D:
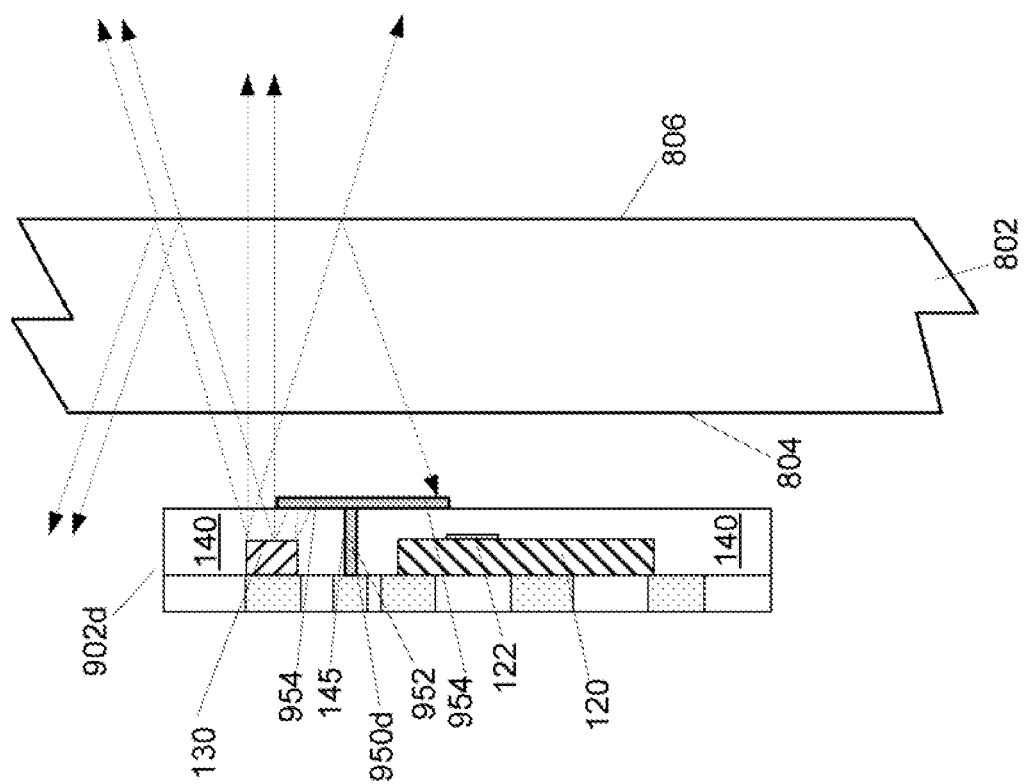
FIG. 9D is a cross-section of an optical sensor device including a T-shaped barrier, according to another embodiment of the present invention.

For the embodiments of FIGS. 9C and 9D, the second portion 954 (and optionally also the third portion 956) can be formed above the outermost (i.e., top) surface of the light transmissive material 140 after step 508 (of FIG. 5), or between steps 608 and 610 (of FIG. 6).

In further embodiments, a lens 1010 is placed at least partially over the light emitting element(s) of the light source die 130, off-centered relative to the center of the light emitting element(s). More specifically, the center of the lens 1010 is offset in a direction away from the first portion 952 of the barrier 950, as shown in FIG. 10, where line 1012 represents the center of the light emitting element(s). By re-directing the light output by the light source die 130 (or at least a portion of such light) in a direction away the light detector die 120, the off-centered lens 1010 reduces the amount of specular reflections (and thereby reduces the amount of light detected by the active area 122 of light detector die 120 that would otherwise be due to specular reflections), and thereby, increases the sensitivity of the sensor. As shown in FIG. 10, the off-centered lens 1010 can be used with the L-shaped barrier 950a of FIG. 9A, or can alternatively be used with the L-shaped barrier 950c of FIG. 9C. In other embodiments, the off-centered lens 1010 can be used together with the T-shaped barriers 950b and 950d of FIGS. 9B and 9D. In still other embodiments, the off-centered lens 1010 can be used with the barrier 150 shown in FIGS. 3A, 3B, 4A, 4B, 7 and 8.

In FIG. 10, the lens 1010 is shown as being convex. However, alternative positive or converging lens may be used. The lens 1010, or an alternative lens, can be formed as part of, or after, step 504 (or 604) when the light detector die, the light source die and the space therebetween are covered with a light transmissive material (e.g., 140). For example, where the light transmissive material is formed using cast molding or transfer molding, the lens can be formed by a feature of the mold. In other embodiments, the lens is machined into the top surface of the light transmissive material 140. In still other embodiments, the lens is formed separately, and attached to the top surface of the light transmissive material 140, e.g., using a clear or other light transmissive epoxy.

Explained above with reference to FIGS. 8-10 are how an L-shaped barrier (e.g., 950a or 950c), a T-shaped barriers (e.g., 950b or 950d), and an off-centered lens (e.g., 1010) can be used to improve the performance of the optical sensors 102, 102' and 102" initially described with reference to FIGS. 1-7 (e.g., improve sensitivity be reducing the potential effects of specular reflections). Specific techniques for forming the various opaque light barriers have also be described above. Further embodiments of the present invention are directed to the use of an L-shaped barrier (similar to 950a or 950c), a T-shaped barrier (similar to 950b or 950d), and/or the use of an off-centered lens (e.g., similar to 1010), with any optical sensor including a light source and a light detector, regardless of how the barrier and the remainder of the sensor is manufactured. For example, an L-shaped barrier (similar to 950a or 950c) or a T-shaped barrier (similar to 950b or 950d) can be formed using injection molding, or some other molding process, before or after a light source and a light detector are placed on opposing sides of a first portion (similar to 952) of the barrier. For another example, at least a portion of a light source can be covered with a lens that is off-centered (relative to a center of the one or more light emitting elements of the light source), such that the center of the lens is offset in a direction away from the first portion (similar to 952) of the opaque light barrier, regardless of how the barrier and the remainder of the sensor is manufactured. In other words, the techniques for reducing specular reflections, and reducing the amount of specular reflections that would be detected by a light detector if a light transmissive cover is placed over an optical sensor, can be applied to alternative optical sensors, while still being with the scope of specific embodiments of the present invention. Systems including sensors 902a, 902b, 902c or 902d, or the alternative sensors just described above, can resemble the system 700 describe with reference to FIG. 7, but are not limited thereto.

Figure 11:
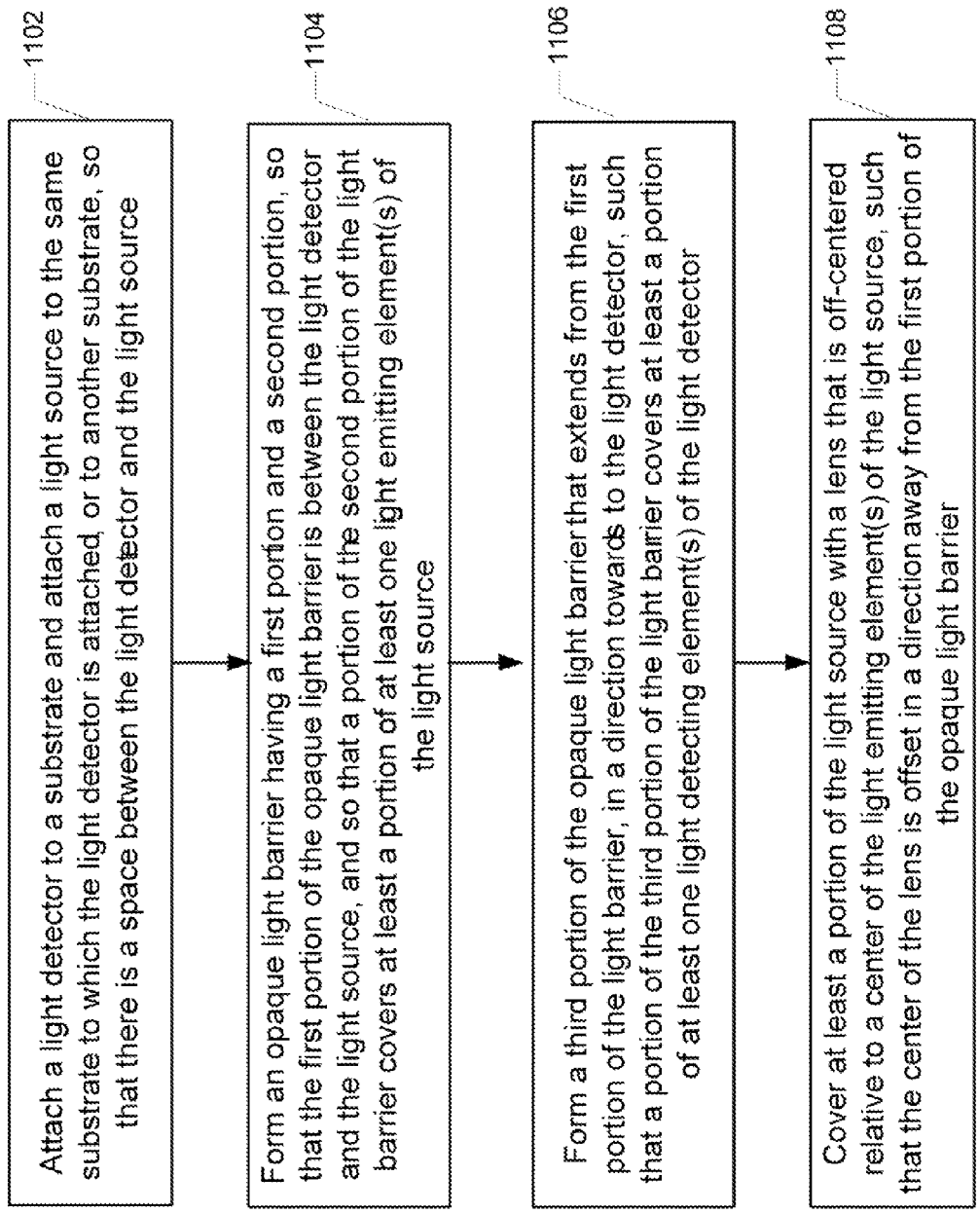
FIGS. 11 and 12 are high level flow diagrams that are used to summarize specific embodiments of the present invention that can be used to provide optical sensor devices.
Figure 12:
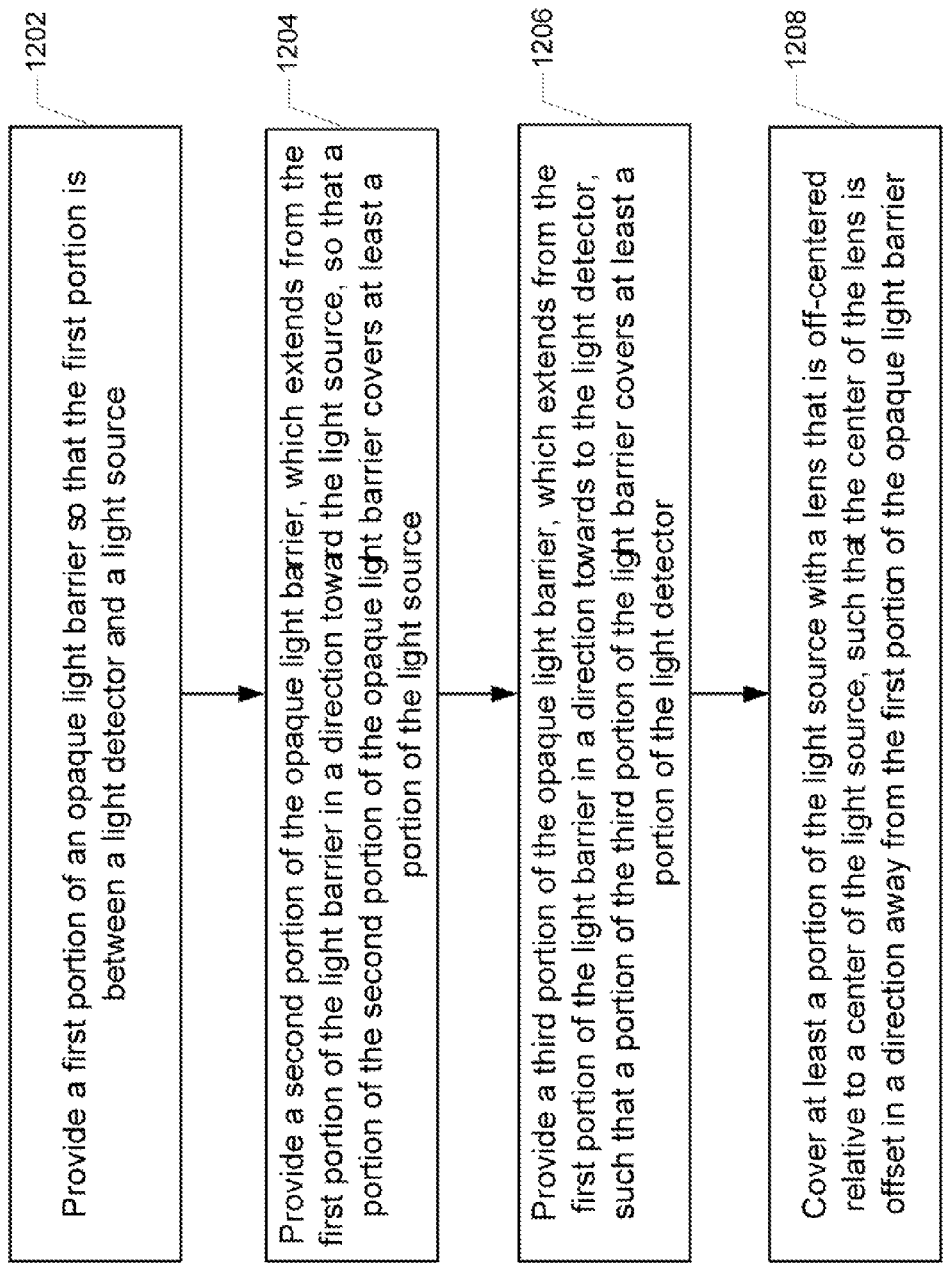

FIGS. 11 and 12 are used to summarize specific embodiments of the present invention that can be used to provide an optical sensor device. In these FIGS., depending upon the embodiment, the steps can be performed in a different order and/or certain steps can be performed while other(s) are not. For example, referring to FIG. 11, step 1106 can be performed after step 1108, or not at all. For another example, it is possible to form the so called first and third portions of the light barrier, without forming the second portion. For another s example, in FIG. 12, steps 1202, 1204 and 1206 can be performed at the same time. For a further example, in FIG. 12, only one or two of steps 1204, 1206 and 1208 can be performed. These are just a few examples, which are not meant to be all inclusive.

FIG. 13 is a top view of an alternative optical sensor device 1302 (e.g., a proximity sensor device) that can benefit from embodiments of the present invention that reduce specular reflections. FIGS. 14A and 14B are alternative cross-sections of the device 1302 of FIG. 13 along dashed line B-B. In these FIGS., and the further figures discussed below, elements that are the same or similar to those discussed with reference to earlier figures are labeled in the same manner, and are not re-explained in detail, since they were already discussed above.

Referring to FIG. 13, the optical sensor device 1302 is shown as including an opaque peripheral wall 1304 that is molded around the leadframe or other die attachment substrate 110. Additionally, the barrier 150 of the optical sensor device 1302 is also molded from the same opaque material and can be formed at the same time as the peripheral wall 1304. Further, as can be seen from FIG. 13, the opaque material can also be located between the various bond pads 114. Various molding techniques, such as injection molding, could be used to form the peripheral wall 1304, the barrier 150 and the material between the bond pads 114. The opaque material can be an opaque epoxy (e.g., a black epoxy) or other opaque resin or polymer that does not allow the wavelength(s) of light produced by the light emitter die 130 to pass therethrough. For a more specific example, the opaque material could be a molding compound, such as black liquid crystal polymer (LCP).

FIGS. 14A and 14B are alternative cross-sections of the optical sensor 1302 shown in FIG. 13, and are thus labeled 1302a and 1302b. As can be seen from these FIGS., the opaque peripheral wall 1304 and the opaque barrier 150 form a pair of adjacent cavities. In one of the cavities is attached the light detector die 120, and in the other cavity is attached the light source die 130. In the embodiment shown in FIG. 14A, each of the two cavities if filled with a light transmissive material 140, which as mentioned above, can be a clear epoxy, or other light transmissive resin or polymer that is molded (e.g., transfer molded or cast molded) or otherwise formed over the light detector die 120, the light source die 130 and the die attachment substrate 110. In accordance with an embodiment, when filling the cavities with the light transmissive material the cavities are slightly overfilled such when the light transmissive material is cured the outermost (i.e., top) surface of the cured light transmissive material 140 is substantially flush with the outermost (i.e., top) surfaces the of the opaque light barrier 150 and the peripheral wall 1304.

In the embodiment of FIG. 14B, instead of filling the cavities with the light transmissive material, a conformal coating 1440 is provided over the light detector die 120 and the light source die 130. The conformal coating can be a silicon conformal coating, but alternatively (or additionally) can include, e.g., an acrylic, epoxy, urethane and/or parxylene conformal coating. There would likely be an air gap 1442 above the conformal coating 1440, as shown in FIG. 14B.

For the same reasons as were discussed above with reference to FIG. 8, if the optical sensor 1302 is placed behind or covered by a cover plate (made of glass, plastic, or some other protective light transmissive material), at least some of the light rays, or portions thereof, can be reflected back toward the active area 122 of the light detector die 120 due to specular reflections. To reduce and preferably prevent the detection of specular reflections by the light detector die 120 (and more specifically, by the active area 122 of the light detector die 120), one or more shelves of the types discussed above with reference to FIGS. 9A-9D can be added, as will now be described in additional detail.

Referring to the optical sensor device 1502a in FIG. 15A, the light barrier 150 can be modified (e.g., added to) to provide the light barrier 950a introduced above in the discussion of FIG. 9A. As was explained with reference to FIG. 9A, the light barrier 950a includes a first portion 952 (similar to barrier 150) that prevents light produced by the light source die 130 from travelling directly to the light detector die 120, in the same manner as did light barrier 150. Additionally, the light barrier 950a includes a second portion 954 that reduces specular reflections. This second portion 954, which extends from the first portion, forms a shelf over the light source die 120, and in an embodiment, covers at least a portion of a light emitting element(s) of the light source die 120, as shown. The light barrier 950a can be considered "L-shaped" because the first and second portions 952 and 954 collectively resemble the letter "L". In specific embodiments, the second portion 954 of the light barrier 950*a* is perpendicular to the first portion 952.

As was explained above, the second portion 954 of the light barrier 950*a* reduces the amount of specular reflections, and thereby reduces (and preferably minimizes) the amount of light detected by the active area 122 of light detector die 120 that would otherwise be due to specular reflections, if the sensor is used with a cover plate (e.g., 802). In this manner, the second portion 954 of the light barrier 950*a* increases the sensitivity of the sensor. Stated another way, the second portion 954 of the light barrier 950*a* increases the percentage of light that will be detected by the active area 122 of light detector die 120 that is actually due to reflections by an object on the far side of the cover plate 902 (as opposed to reflections from the cover plate 802 itself).

Referring to the optical sensor device 1502*b* of FIG. 15B, in accordance with an embodiment of the present invention, a light barrier 950*b* includes the first portion 952 (similar to barrier 150), the second portion 954 (that reduces specular reflections in the same manner described with reference to FIG. 9A), and a third portion 956 that reduces the detection of specular reflections (in the same manner described with reference to FIG. 9B). This third portion 956 forms a shelf over the light detector die 130, and in an embodiment, covers at least a portion of the active area 122, as shown. Such a light barrier 950*b* can be considered "T-shaped" because the first, second and third portions 952, 954 and 956 collectively resemble the letter "T". In specific embodiments, the second portion 952 and the third portion 954 of the light barrier 950*b* are each perpendicular to the first portion 952. In another embodiment, a barrier includes the portion 952 and 956, but not the portion 952, in which case, the barrier could be L-shaped.

The third portion 956 of the light barrier 950*b* reduces the amount of specular reflections that are detected by the active area 122 of the light detector die 120, and thereby, increases the sensitivity of the sensor. Stated another way, the third portion 956 of the light barrier 950*b* blocks at least some specular reflections that would otherwise be detected by the active area 122 of the light detector die 120 if the third portion 956 were not included.

In certain embodiments, the first portion 952 and/or the third portion 956 (of the L or T-shaped light barrier), can be formed by saw cutting, blade cutting or laser cutting shallow grooves (also referred to as trenches) into the light transmissive material 140 on one side (or both sides) of the barrier 150 shown in FIG. 14A. Such shallow groove(s) should have the desired dimensions of the second and/or third portions 954 and/or 956. Alternatively, where a mold is used, a groove corresponding to the second portion 954 and/or a groove corresponding to the third portion 956 of the barrier 950*a* (or 950*b*) can be formed by corresponding features of the mold. The groove(s) that are forming, e.g., by cutting or a mold, can then be filled with an opaque material to form the second portion 954 and/or the third portion 956 of the barrier 950*a* (or 950*b*). The same opaque material used to form the barrier 150/952 can be used to form the second portion 954 (and optionally also the third portion 956), or a different opaque material can be used.

In FIGS. 15A and 15B, the outermost surface of the second portion 954 (and optionally also the third portion 956) of the light barrier 950*a* (or 950*b*) is shown as being substantially flush with the outermost (i.e., top) surface of the light transmissive material 140. Referring now to the optical sensor devices 1502*c* and 1502*d* of FIGS. 15C and 15D, in alternative embodiments, the second portion 954 (and optionally also the third portion 956) can be formed above the outermost (i.e., top) surface of the light transmissive material 140, in a similar manner as was discussed above with reference to FIGS. 9C and 9D. The second portion 954 (and optionally also the third portion 956) of the barrier 950*c* (or 950*d*) can be formed above the outermost (i.e., top) surface of the light transmissive material 140 in a single or multi-pass process, e.g., using an automated dispensing system and/or using a mask (similar to a lithography mask) or screen (similar to a silk screen), but is not limited thereto. In other words, the second portion 954 (and optionally also the third portion 956) of the barrier 950*c* (or 950*d*) can essentially be painted or otherwise deposited in the desired pattern onto the outermost (i.e., top) surface of the light transmissive material 140, with portions of the pattern overlapping the outermost (i.e., top) surface of the first portion 150/952 of the barrier 950*c* (or 950*d*). In such embodiments, the second portion 954 (and optionally also the third portion 956) still extend from the first portion 952. The same opaque material used to form the first portion 150/952 of the barrier can be used to form the second portion 954 (and optionally also the third portion 956), or a different opaque material can be used.

Referring to the optical sensor devices 1602*a* and 1602*b* of FIGS. 16A and 16B, in further embodiments of the present invention, a generally planer aperture plate 1604*a* or 1604*b* that includes the barrier portions 954 and/or 956 can be attached to the sensor. For example, the aperture plate 1604*a* or 1604*b* can be attached to the opaque peripheral wall 1304, the exposed outermost (i.e., top) edge of the barrier portion 150/952, and to a portion of the outermost (i.e., top) surface of the light transmissive material 140. The aperture plate can be, e.g., an etched metal plate or a molded plastic plate, which is preformed and thereafter glued to the sensor before or after encapsulation. Such an aperture plate can be attached to a plurality of sensors (e.g., 200 sensors) before sensors are sawed apart. A molded plastic aperture plate 1602*a* or 1602*b* can be made, e.g., from an opaque liquid crystal polymer (LCP), but is not limited thereto. An etched metal aperture plate 1604*a* or 1604*b* can be made, e.g., of copper plated with nickel or nickel palladium, which is chemically treated to turn black, but is not limited thereto. To minimize light that may leak under the aperture plate from the light source 130 to the light detector 120, the material used to attach the aperture plate should be an opaque epoxy, and most preferably a black epoxy.

FIGS. 17A and 17B show that the aperture plate 1604*a* or 1604*b* can be attached to a sensor 1702*a* or 1702*b* that includes the conformal coating 1440 over the light detector die 120 and the light source die 130, instead of the cavities being filled with the light transmissive material 140 (as in FIGS. 16A and 16B). In the embodiments of FIGS. 17A and 17B the aperture plate 1604*a* or 1604*b* can be attached to the opaque peripheral wall 1304 and the exposed outermost (i.e., top) edge of the barrier portion 150/952, and there can be an air gap 1442 between the conformal coating 1440 and the barrier portions 954 and/or 956.

An off-centered lens, similar to the lens 1010 discussed above with reference to FIG. 10, can also be added to the optical sensors devices of FIGS. 15A-15D and 16A-16B to re-direct the light output by the light source die 130 (or at least a portion of such light) in a direction away the light detector die 120. As was explained above, such a lens can be used to reduce the amount of specular reflections (and thereby reduces the amount of light detected by the active area 122 of light detector die 120 that would otherwise be due to specular reflections), and thereby, increases the sensitivity of the sensor. Such a lens can also increase the intensity of the optical beam produced by the light source die 130, by focusing more of the light into a common beam. Referring to FIG. 18, in accordance with an embodiment, a plurality of lenses 1810 can be cast in a mold, and then saw cut or otherwise separated (along the dashed lines in FIG. 18) to provide individual lenses. As shown in FIG. 19, an individual lens 1810 can then be glued using a light transmissive epoxy (e.g., a clear epoxy) onto the outermost (i.e., top) surface of the light transmissive material 140 to provide an optical sensor device 1902. FIG. 19 shows the individual lens 1810 being added to the optical device originally shown in FIG. 16A, but such a lens can be added to the various other optical device embodiments.

Embodiments of the present invention are also directed to methods for providing the optical sensor devices described above. In accordance with an embodiment, first and second cavities are formed that are separated by a first opaque light barrier portion (e.g., 150/952). A light source (e.g., 130) is attached within the first cavity and a light detector (e.g., 120) is attached within the second cavity so that the first opaque light barrier portion is between the light detector and the light source. Additionally, a second opaque light barrier portion (e.g., 954) is formed that extends from the first opaque light barrier portion, in a direction towards the first cavity. As was explained above, the second opaque light barrier portion is configured to reduce an amount of specular reflections, if a light transmissive cover plate (e.g., 806) were placed over the first and second cavities.

In accordance with an embodiment, before the second opaque light barrier portion is formed, the first and second cavities can be substantially filed with a light transmissive material (e.g., 140) so that the light transmissive material covers the light source and the light detector. The second opaque light barrier portion can then be formed by depositing an opaque material in a trench formed in the light transmissive material covering the light source within the first cavity, e.g., as discussed above with reference to FIG. 15A. Alternatively, the second opaque light barrier portion can be formed by depositing an opaque material on a portion of an outermost surface of the light transmissive material covering the light source within the first cavity, e.g., as discussed above with reference to FIG. 15C. In another embodiment, the second opaque light barrier portion is formed by covering a portion of an outermost surface of the light transmissive material with a portion of an aperture plate, e.g., as discussed above with reference to FIGS. 16A and 17A. An opaque epoxy can be used to attach a portion of the aperture plate to the portion of the outermost surface of the light transmissive material and to a portion of an outermost portion of the first opaque light barrier portion. Such an aperture plate can also be used where the cavities are not substantially filled with the light transmissive material, e.g., as discussed above with reference to FIG. 17A.

In accordance with an embodiment, a third opaque light barrier portion (e.g., 956) is formed that extends from the first opaque light barrier portion, in a direction towards the second cavity. The third opaque light barrier portion is configured to reduce an amount of specular reflections that would be detected by the one or more light detecting elements of the light detector, if a light transmissive cover plate were placed over the first and second cavities.

Embodiments of the present invention are also directed to a device that includes a light source, a light detector, and a first opaque light barrier portion, between the light source and the light detector, configured to block light from being transmitted directly from the light source to the light detector. The device also includes a second opaque light barrier portion extending from the first opaque light barrier portion in a direction toward the light source. Additionally, the device includes a light transmissive cover placed over the light source and the light detector. In such embodiments, the second opaque light barrier portion is configured to reduce an amount of specular reflections caused by the light transmissive cover being placed over the light source. The device can also include the third opaque light barrier portion to reduce an amount of specular reflections detected by the light detector.

The forgoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art. Embodiments were chosen and described in order to best describe the principles of the invention and its practical application, thereby enabling others skilled in the art to understand the invention. Slight modifications and variations are believed to be within the spirit and scope of the present invention. It is intended that the scope of the invention be defined by the following claims and their equivalents.

What is claimed is:

1. An optical sensor device, comprising:
   a light source die including one or more light emitting elements;
   a light detector die including one or more light detecting elements;
   a first opaque light barrier portion configured to block light from being transmitted directly from the light source die to the light detector die, said first opaque light barrier portion between the light source die and the light detector die;
   a light transmissive material covering the light source die and the light detector die; and
   a second opaque light barrier portion configured to reduce an amount of specular reflections, if a light transmissive cover plate were placed over the optical sensor device;
   said second opaque light barrier portion extending from the first opaque light barrier portion, in a direction towards the light source die, a distance greater than an entire gap between the first opaque light barrier portion and at least one of the one or more light emitting elements of the light source die;
   wherein the first opaque light barrier portion separates a portion of the light transmissive material covering the light source die from a portion of the light transmissive material covering the light detector die; and
   wherein the second opaque light barrier portion extends over a portion of an outermost surface of the portion of the light transmissive material covering the light source die.

2. The optical sensor device of claim 1, wherein a portion of the second opaque light barrier portion covers at least a portion of at least one of the one or more light emitting elements of the light source die.

3. The optical sensor device of claim 1, wherein:
   the first opaque light barrier portion and the second opaque light barrier portion are separately formed;
   the first opaque light barrier portion and the second opaque light barrier portion are generally perpendicular to one another; and
   a portion of the first opaque light barrier portion is connected by an opaque epoxy to a portion of the second opaque light barrier portion so that light from the light source die does not leak between the first and second opaque light barrier portions.

4. The optical sensor device of claim 1, wherein:
the first opaque light barrier portion separates first and second cavities of the optical sensor device;
the light source die is located within the first cavity;
the light detector die is located within the second cavity; and
the second opaque light barrier portion covers a portion of the first cavity.

5. The optical sensor device of claim 4, wherein the first and second cavities are substantially filled with the light transmissive material that covers the light source die and the light detector die.

6. The optical sensor device of claim 5, wherein the second light barrier portion comprises an opaque material that fills a trench formed in the outermost surface of the portion of the light transmissive material covering the light source die within the first cavity.

7. The optical sensor device of claim 5, wherein the second light barrier portion comprises an opaque material that is deposited on a portion of the outermost surface of the portion of the light transmissive material covering the light source die within the first cavity.

8. The optical sensor device of claim 4, wherein the second light barrier portion comprises a portion of an aperture plate that covers a portion of the outermost surface of the portion of the light transmissive material covering the light source die within the first cavity.

9. The optical sensor device of claim 4, wherein the second light barrier portion comprises a portion of an aperture plate that covers a portion of the first cavity.

10. The optical sensor device of claim 1, wherein the second light barrier portion comprises a portion of an aperture plate.

11. The optical sensor device of claim 1, further comprising a third opaque light barrier portion configured to reduce an amount of specular reflections that would be detected by the one or more light detecting elements of the light detector die, if a light transmissive cover plate were placed over the optical sensor device, said third opaque light barrier portion extending from the first light barrier portion in a direction towards to the light detector die.

12. The optical sensor device of claim 11, wherein a portion of the third opaque light barrier portion covers at least a portion of at least one of the one or more light detecting elements of the light detector die.

13. The optical sensor device of claim 12, wherein:
the first opaque light barrier portion separates first and second cavities of that optical sensor device;
the light source die is located within the first cavity;
the light detector die is located within the second cavity; and
the second opaque light barrier portion covers a portion of the first cavity; and
the third opaque light barrier portion covers a portion of the second cavity.

14. The optical sensor device of claim 13, wherein the second light barrier portion and the third light barrier portion comprise portions of an aperture plate that covers portions of the first and second cavities.

15. The optical sensor device of claim 1, wherein the first opaque light barrier portion and the second opaque light barrier portion are continuously formed from the same material.

16. The optical sensor device of claim 1, further comprising:

a lens covering at least a portion of the light source die and laterally located relative to the second opaque light barrier portion;
wherein the lens is off-centered relative to a center of the one or more light emitting elements of the light source die, such that a center of the lens is offset in a direction away from the first opaque light barrier portion; and
wherein the lens is configured to reduce an amount of specular reflections that would be detected by the light detector die, if a light transmissive cover plate were placed over the optical sensor device.

17. A method for providing an optical sensor device, comprising:
(a) forming first and second cavities that are separated by a first opaque light barrier portion;
(b) attaching a light source die within the first cavity and a light detector die within the second cavity so that the first opaque light barrier portion is between the light detector die and the light source die, wherein the light detector die includes one or more light detecting elements, and the light source die includes one or more light emitting elements; and
(c) covering the light source die and the light detector die with a light transmissive material; and
(d) forming a second opaque light barrier portion that extends from the first opaque light barrier portion, in a direction towards the first cavity, a distance greater than an entire gap between the first opaque light barrier portion and at least one of the one or more light emitting elements of the light source die, such that the second opaque light barrier potion and extends over a portion of an outermost surface of a portion of the light transmissive material covering the light source die,
wherein the second opaque light barrier portion is configured to reduce an amount of specular reflections, if a light transmissive cover plate were placed over the first and second cavities.

18. The method of claim 17, wherein step (c) comprises substantially filling the first and second cavities with the light transmissive material so that the light transmissive material covers the light source die and the light detector die.

19. The method of claim 17, wherein step (d) comprises forming the second opaque light barrier portion by depositing an opaque material in a trench formed in the outermost surface of the portion of the light transmissive material covering the light source die within the first cavity.

20. The method of claim 17, wherein step (d) comprises forming the second opaque light barrier portion by depositing an opaque material on a portion of the outermost surface of the portion of the light transmissive material covering the light source die within the first cavity.

21. The method of claim 17, wherein step (d) comprises forming the second opaque light barrier portion by covering a portion of the outermost surface of the portion of the light transmissive material covering the light source die within the first cavity with a portion of an aperture plate.

22. The method of claim 21, wherein step (d) further comprises using an opaque epoxy to attach a portion of the aperture plate to the portion of the outermost surface of the portion of the light transmissive material covering the light source die within the first cavity and to a portion of an outermost portion of the first opaque light barrier portion.

23. The method of claim 17, wherein step (d) comprises forming the second opaque barrier portion by covering a portion of the first cavity with a portion of an aperture plate.

24. The method of claim 23, wherein step (d) further comprises using an opaque epoxy to attach a portion of the aperture plate to an outermost portion of the first opaque light barrier portion.

25. The method of claim 17, further comprising:
(e) forming a third opaque light barrier portion that extends from the first opaque light barrier portion, in a direction towards the second cavity, wherein the third opaque light barrier portion is configured to reduce an amount of specular reflections that would be detected by the one or more light detecting elements of the light detector die, if a light transmissive cover plate were placed over the first and second cavities.

26. The method of claim 17, further comprising:
(e) covering at least a portion of the light source die with a lens that is off-centered relative to a center of the one or more light emitting elements of the light source die, such that the center of the lens is offset in a direction away from the first opaque light barrier portion, and such that the lens is laterally located relative to the second opaque light barrier portion.

27. A device, comprising:
a light source die including one or more light emitting elements;
a light detector die including one or more light detecting elements;
a light transmissive material covering the light source die and the light detector die;
a first opaque light barrier portion configured to block light from being transmitted directly from the light source die to the light detector die, said first opaque light barrier portion between the light source die and the light detector die; and
a second opaque light barrier portion extending over a portion of an outermost surface of the portion of the light transmissive material covering the light source die and extending from the first opaque light barrier portion, in a direction toward the light source die, a distance greater than an entire gap between the first opaque light barrier portion and at least one of the one or more light emitting elements of the light source die; and
a light transmissive cover plate placed over the light transmissive material, and thus, over the light source die and the light detector die;
wherein the second opaque light barrier portion is configured to reduce an amount of specular reflections caused by the light transmissive cover plate being over the light source die.

28. The device of claim 27, wherein a portion of the second opaque light barrier portion covers at least a portion of at least one of the one or more light emitting elements of the light source die.

29. A system, comprising:
a light source die including one or more light emitting elements;
a driver configured to drive the light source die;
a light detector die including one or more light detecting elements and configured to produce a signal indicative of an amount of detected light;
a processor and/or circuitry configured to detect a proximity of an object in dependence on the signal indicative of the amount of detected light;
a subsystem configured to be enabled or disable based on the detected proximity of an object;
a light transmissive material covering the light source die and the light detector die;
a first opaque light barrier portion configured to block light from being transmitted directly from the light source die to the light detector die, said first opaque light barrier portion between the light source die and the light detector die;
a second opaque light barrier portion extending from the first opaque light barrier portion, in a direction toward the light source die, a distance greater than an entire gap between the first opaque light barrier portion and at least one of the one or more light emitting elements of the light source die; and
a light transmissive cover placed over the light source die and the light detector die;
wherein the second opaque light barrier portion is configured to reduce an amount of specular reflections caused by the light transmissive cover being placed over the light source die;
wherein the first opaque light barrier portion separates a portion of the light transmissive material covering the light source die from a portion of the light transmissive material covering the light detector die; and
wherein the second opaque light barrier portion covers a portion of an outermost surface of the portion of the light transmissive material covering the light source die.

* * * * *

UNITED STATES PATENT AND TRADEMARK OFFICE
CERTIFICATE OF CORRECTION

| | | |
|---|---|---|
| PATENT NO. | : 8,324,602 B2 | Page 1 of 1 |
| APPLICATION NO. | : 12/643831 | |
| DATED | : December 4, 2012 | |
| INVENTOR(S) | : Wiese et al. | |

It is certified that error appears in the above-identified patent and that said Letters Patent is hereby corrected as shown below:

On Title page 2, References Cited Item (56) Other Publications, Column 2, line 32, "Office Action dated Apr. 13, 2012, in U.S. Appl. No. 12/490,723" should be -- Office Action dated April 13, 2012, in US Patent Application No. 12/499,723 --

Signed and Sealed this
Thirtieth Day of April, 2013

Teresa Stanek Rea
*Acting Director of the United States Patent and Trademark Office*